(12) United States Patent
Kim et al.

(10) Patent No.: US 11,450,833 B2
(45) Date of Patent: Sep. 20, 2022

(54) DISPLAY PANEL HAVING SEALING MEMBER INCLUDING ARRANGEMENT OF MELTING PATTERNS AND FUSING PATTERNS

(71) Applicant: Samsung Display Co., LTD., Yongin-si (KR)

(72) Inventors: Jung Hyun Kim, Suwon-si (KR); Kyung Rok Ko, Suwon-si (KR); Yong Hoon Kwon, Suwon-si (KR); Byung Hoon Kim, Hwaseong-si (KR); Tae Oh Kim, Hwaseong-si (KR); So Mi Jung, Susan (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 71 days.

(21) Appl. No.: 17/062,245

(22) Filed: Oct. 2, 2020

(65) Prior Publication Data
US 2021/0280814 A1 Sep. 9, 2021

(30) Foreign Application Priority Data
Mar. 6, 2020 (KR) .................... 10-2020-0028242

(51) Int. Cl.
*H01L 51/52* (2006.01)
*H01L 51/56* (2006.01)

(52) U.S. Cl.
CPC ............ *H01L 51/524* (2013.01); *H01L 51/56* (2013.01)

(58) Field of Classification Search
CPC . H01L 51/524; H01L 51/5246; H01L 51/525; H01L 51/56

USPC ........................................................ 257/40
See application file for complete search history.

(56) References Cited

U.S. PATENT DOCUMENTS

| 2019/0047251 | A1* | 2/2019 | Song | B32B 9/04 |
| 2021/0217986 | A1* | 7/2021 | Kwon | C03C 27/044 |
| 2021/0280814 | A1* | 9/2021 | Kim | H01L 51/56 |
| 2021/0280818 | A1* | 9/2021 | Ko | H01L 51/56 |
| 2021/0296609 | A1* | 9/2021 | Park | H01L 51/5246 |

(Continued)

FOREIGN PATENT DOCUMENTS

| JP | 201513760 A | 1/2015 |
| KR | 1020170003898 A | 1/2017 |

(Continued)

*Primary Examiner* — Matthew E. Gordon
(74) *Attorney, Agent, or Firm* — Cantor Colburn LLP

(57) ABSTRACT

A display device includes a display panel including a display area and non-display areas surrounding the display area; an encapsulation substrate disposed on the display panel and including melting patterns formed in regions overlapping the non-display areas; a sealing member disposed between the display panel and the encapsulation substrate to couple the display panel with the encapsulation substrate; and fusing patterns disposed across the sealing member and the encapsulation substrate. The display panel further includes a metal line layer disposed in at least a portion of the non-display areas, at least a portion of the sealing member is disposed on the metal line layer in the non-display areas, the melting patterns are disposed to overlap the metal line layer in a thickness direction, and the fusing patterns are disposed not to overlap the metal line layer in the thickness direction.

21 Claims, 26 Drawing Sheets

(56) References Cited

U.S. PATENT DOCUMENTS

2022/0140270 A1* 5/2022 Kubo .................. H05B 33/10
257/40

FOREIGN PATENT DOCUMENTS

| KR | 101866624 B1 | 6/2018 |
| KR | 1020190055860 A | 5/2019 |

* cited by examiner

DISPLAY PANEL HAVING SEALING MEMBER INCLUDING ARRANGEMENT OF MELTING PATTERNS AND FUSING PATTERNS

This application claims priority to Korean Patent Application No. 10-2020-0028242 filed on Mar. 6, 2020, and all the benefits accruing therefrom under 35 U.S.C. § 119, the content of which in its entirety is herein incorporated by reference.

BACKGROUND

1. Field of the Disclosure

The present disclosure relates to a display device and a method of fabricating the same.

2. Description of the Related Art

A display device becomes more and more important as multimedia technology evolves. Accordingly, a variety of types of display devices such as organic light-emitting display ("OLED") devices and liquid-crystal display ("LCD") devices are currently used.

The display device is for displaying images and includes a display panel such as an organic light-emitting display panel or a liquid-crystal display panel. Among them, light-emitting display panel may include light-emitting elements. For example, light-emitting diodes ("LEDs") may include an organic light-emitting diode (OLED) using an organic material as a fluorescent material, and an inorganic light-emitting diode using an inorganic material as a fluorescent material.

SUMMARY

Aspects of the present disclosure provide a display device in which a bonding force of a sealing member for bonding is enhanced between a display panel and an encapsulation substrate, and a method of face the same.

It should be noted that advantages and features of the present disclosure are not limited to the above-mentioned advantages and features; and other advantages and features of the present invention will be apparent to those skilled in the art from the following descriptions.

According to an exemplary embodiment of the present disclosure, a display device may include a display panel, an encapsulation substrate, and a sealing member for bonding them together. The display device may include fusing patterns formed as materials of the sealing member, the encapsulation substrate and the display panel are fused and attached at the boundary between the sealing member and the encapsulation substrate and the boundary between the sealing member and the display panel. In order to prevent a metal line layer of the display panel from being damaged by the fusing patterns, melting patterns may be disposed in the encapsulation substrate. The melting patterns may have a refractive index different from that of the nearby region, and can prevent the pulsed laser irradiated during a process of forming the fusing period of times from being irradiated onto the metal line layer.

The display device according to the exemplary embodiment of the present disclosure includes the melting patterns and the fusing patterns, such that the bonding force of the sealing member can be enhanced, and the durability against external impact can be improved.

It should be noted that advantages and features of the present disclosure are not limited to the above-mentioned advantages and features; and other advantages and features of the present invention will be apparent to those skilled in the art from the following descriptions.

It should be noted that effects of the present disclosure are not limited to those described above and other effects of the present disclosure will be apparent to those skilled in the art from the following descriptions.

According to an embodiment of the present disclosure, a display device includes a display panel including a display area and non-display areas surrounding the display area; an encapsulation substrate disposed on the display panel and including melting patterns disposed in regions overlapping the non-display areas; a sealing member disposed between the display panel and the encapsulation substrate to couple the display panel with the encapsulation substrate; and fusing patterns disposed across the sealing member and the encapsulation substrate, where the display panel further includes a metal line layer disposed in at least a portion of the non-display areas, at least a portion of the sealing member is disposed on the metal line layer in the non-display areas, wherein the melting patterns are disposed to overlap the metal line layer in a thickness direction, and the fusing patterns are disposed not to overlap the metal line layer in the thickness direction.

A maximum width of the melting patterns may be equal to or greater than a width of the metal line layer.

A maximum width of the fusing patterns may be equal to the maximum width of the melting patterns.

Each of the melting patterns may include a melting interface and a melting area that has a different crystal structure from a crystal structure of an adjacent region outside the melting interface.

A refractive index of the melting patterns may be smaller than a refractive index of the adjacent region outside the melting interface.

The melting patterns may be spaced apart from a lower surface of the encapsulation substrate.

The fusing patterns may be disposed across the sealing member, the display panel and the encapsulation substrate, and each of the fusing patterns may include a fusing area where materials of the sealing member, the display panel and the encapsulation substrate are fused.

At least a portion of the sealing member may directly contact the display panel at a first boundary surface and the encapsulation substrate at a second boundary surface, no physical boundary may be on virtual extended lines in the fusing patterns, and the virtual extended lines may extend from the first boundary surface and the second boundary surface where the fusing patterns are formed.

Each of the fusing patterns may include a first portion disposed in the display panel, a second portion disposed in the sealing member, a third portion disposed in the encapsulation substrate, a third boundary surface between the second portion and the sealing member, a fourth boundary surface between the third portion and the encapsulation substrate, and a fifth boundary surface between the first portion and the display panel.

The third portion of each of the fusing patterns may include a material of the sealing member.

The second portion of each of the fusing patterns may include a material of the encapsulation substrate.

A width of the first portion in the virtual extended line extending from the first boundary surface of the fusion pattern may be smaller than a width of the third portion in the virtual extended line extending from the second boundary surface.

A height of the fusing patterns may be greater than a thickness of the sealing member in the thickness direction.

The thickness of the sealing member may range from about 4.5 micrometers (μm) to about 6 μm, and the height of the fusing patterns may range from about 8 μm to about 12 μm.

A maximum width of the fusing patterns may range from about 8 μm to about 12 μm, and the width of the sealing member may be greater than the maximum width of the fusing patterns.

The display device may further include an insulating layer disposed on the display panel in the display areas, where the metal line layer may be disposed on the insulating layer.

According to another embodiment of the present disclosure, a display device includes a first substrate including a display area where a plurality of light-emitting elements is disposed, and non-display areas surrounding the display area; a second substrate disposed on the first substrate and including melting patterns disposed in a region overlapping the non-display areas; a metal line layer disposed on the non-display areas of the first substrate; a sealing member disposed between the first substrate and the second substrate and surrounding the display area in the non-display areas; and fusing patterns disposed in the sealing member between the first substrate and the second substrate, where the second substrate includes a melting pattern area in which the molten patterns are disposed, the melting pattern area is in a portion of the non-display areas in which the metal line layer is disposed, and the fusing patterns are disposed not to overlap with the melting patterns in a plan view.

Each of the melting patterns may include a melting interface and a melting area that has a different crystal structure from a crystal structure of an adjacent region outside the melting interface, and a refractive index of each of the melting patterns may be smaller than a refractive index of the adjacent region outside the melting interface.

The metal line layer may be disposed only in a first non-display area of the non-display area located on one side of the display area, and the melting patterns may be disposed only in a region overlapping the first non-display area.

The metal line layer may be disposed to surround the display area in the non-display area, and the melting patterns may be disposed to overlap the metal line layer in the plan view.

The display device may further include an insulating layer disposed on the first substrate in the non-display areas, and the metal line layer may be disposed on the insulating layer.

According to an embodiment of the present disclosure, a method of fabricating a display device includes preparing a first substrate and a second substrate and irradiating the second substrate with a first pulsed laser to form melting patterns having a refractive index smaller than a refractive index of an adjacent region; forming a sealing member on one surface of the second substrate, and attaching the second substrate and the first substrate together; and irradiating the sealing member disposed between the first substrate and the second substrate with a second pulse laser to form fusing patterns in which materials of the sealing member, the first substrate and the second substrate are fused.

The first pulsed laser and the second pulsed laser may be irradiated at a frequency of about 1 kilohertz (kHz) to about 10 megahertz (MHz) for about 10 femtoseconds (fs) to about 50 picoseconds (ps).

A focus of the first pulsed laser may be set in the second substrate, and a focus of the second pulsed laser may be set in the first substrate.

At least a portion of the sealing member may directly contact the first substrate at a first boundary surface and the second substrate at a second boundary surface, no physical boundary may be on virtual extended lines in the fusing patterns, and the virtual extended lines may extend from the first boundary surface and the second boundary surface.

Each of the melting patterns may include a melting interface and a melting area that has a different crystal structure from a crystal structure of an adjacent region outside the melting interface.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
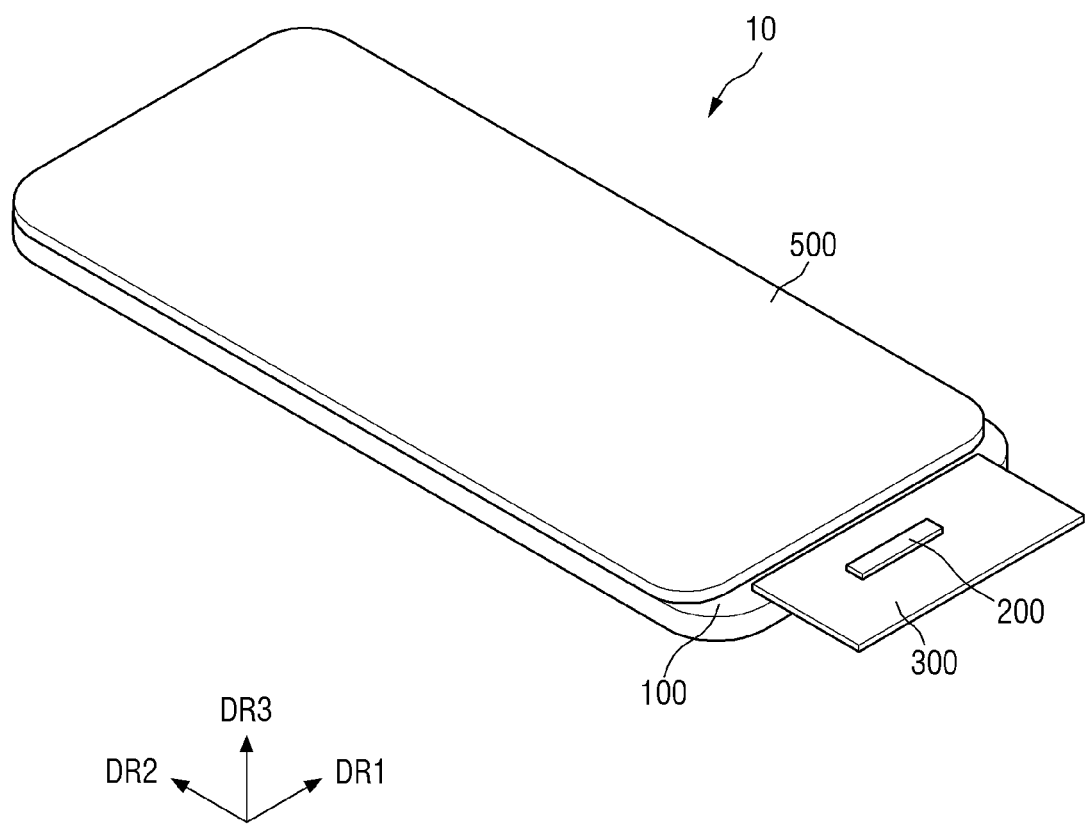
FIG. 1 is a perspective view of a display device according to an exemplary embodiment of the present disclosure.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided such that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Hereinafter, exemplary embodiments of the present disclosure will be described with reference to the accompanying drawings.

Figure 2:
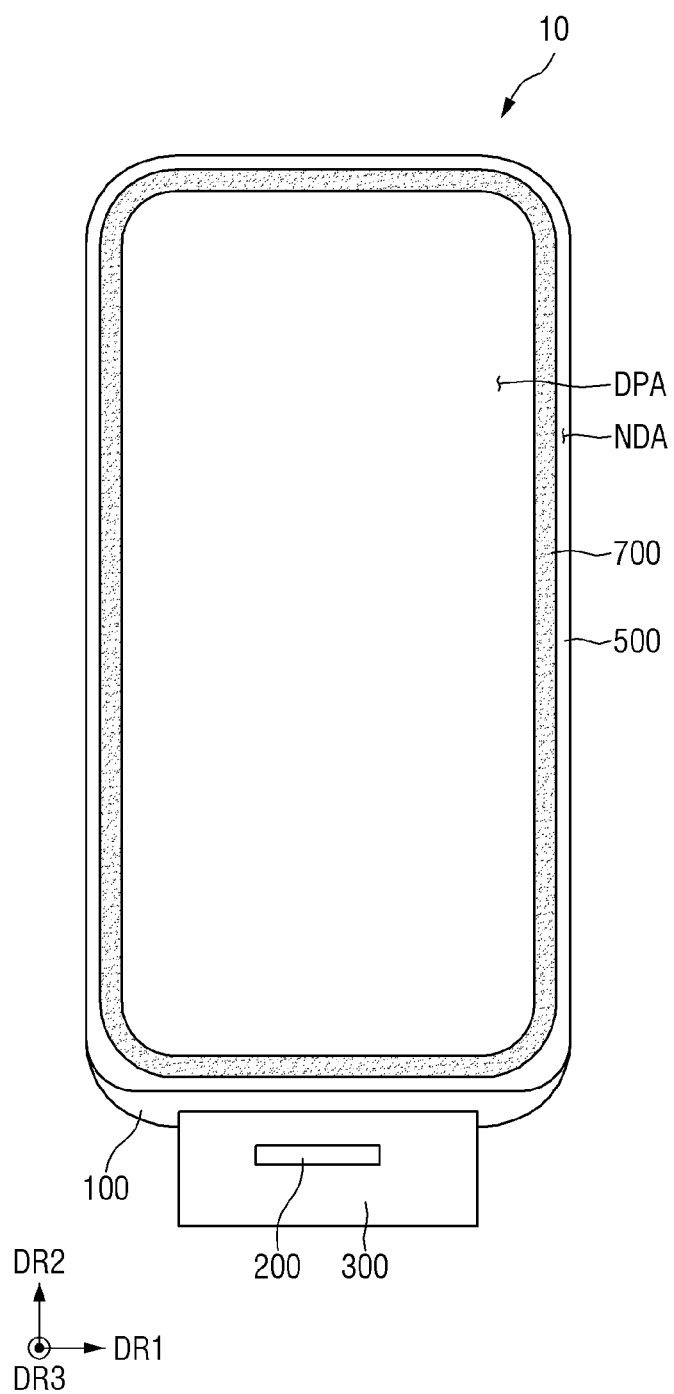
FIG. 2 is a plan view of a display device according to an exemplary embodiment of the present disclosure.
Figure 3:
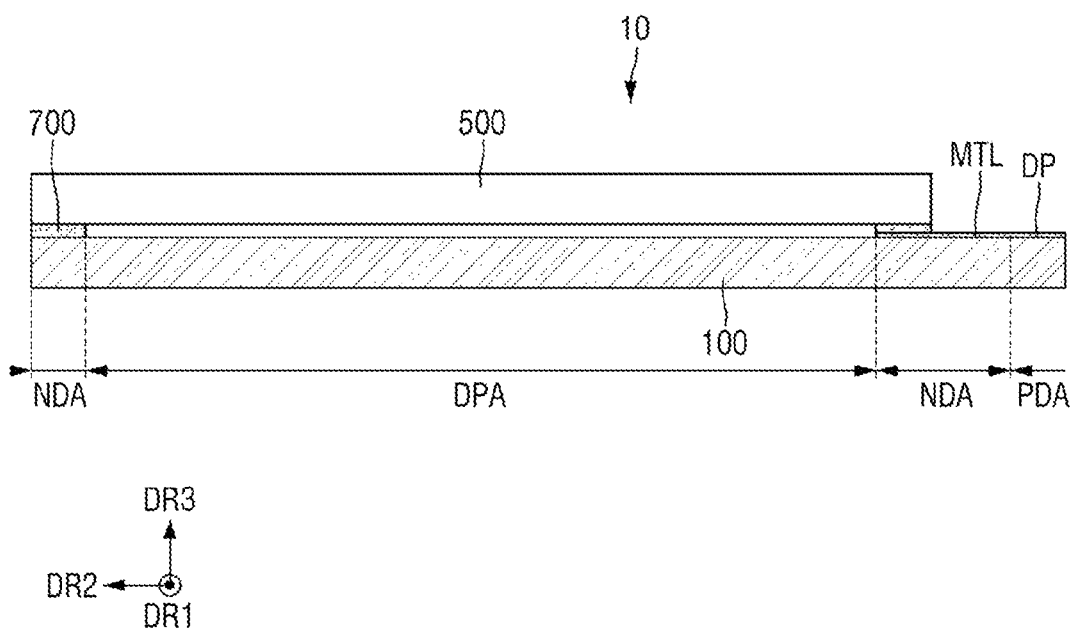
FIG. 3 is a side view of a display device according to an exemplary embodiment of the present disclosure.

FIG. 1 is a perspective view of a display device according to an exemplary embodiment of the present disclosure. FIG. 2 is a plan view of a display device according to an exemplary embodiment of the present disclosure. FIG. 3 is a side view of a display device according to an exemplary embodiment of the present disclosure. FIG. 3 shows only a display panel 100 and an encapsulation substrate 500 while a display circuit board 300 of a display device 10 is not depicted.

As used herein, a first direction DR1 may be parallel to the shorter sides of the display device 10, for example, the horizontal direction of the display device 10 in FIG. 2. A second direction DR2 may be parallel to the longer sides of the display device 10, for example, the vertical direction of the display device 10 in FIG. 2. A third direction DR3 may refer to the thickness direction of the display device 10 as shown in FIG. 1. The first direction DR1 of an object (e.g., the display device 10) may indicate the right side of the object when the object (e.g., the display device 10) is viewed from the top, and the opposite direction to the first direction DR1 of the object may indicate the left side of the object. The second direction DR2 of the object may indicate the upper side of the object in a plan view, and the opposite direction to the second direction DR2 of the object may indicate the lower side of the object. The third direction DR3 of the object may indicate the top of the object, while the opposite direction to the third direction DR3 of the object may indicate the bottom of the object.

A display device 10 shown in FIGS. 1 to 3 may be employed in a variety of electronic devices including small- and-medium-sized electronic devices such as a tablet PC, a smartphone, a vehicle navigation unit, a camera, a center information display ("CID") installed in vehicles, a wrist-type electronic device, a personal digital assistant ("PMP"), a portable multimedia player (PMP) and a game machine, and medium-and-large electronic devices such as a television, an electric billboard, a monitor, a personal computer and a laptop computer. It should be understood that the above-listed electronic devices are merely illustrative, and the display device 10 may be employed in a variety of other electronic devices without departing from the scope of the present disclosure.

The display device 10 may be a light-emitting display device such as an organic light-emitting display device using organic light-emitting diodes, a quantum-dot light-emitting display device including quantum-dot light-emitting layer, an inorganic light-emitting display device including an inorganic semiconductor, and a micro light-emitting display device using micro light-emitting diodes ("LED"). In the following description, an organic light-emitting display device is described as an example of the display device 10. It is, however, to be understood that the present disclosure is not limited thereto.

The display device 10 includes a display panel 100 (or a first substrate), a display driver 200, a display circuit board 300, an encapsulation substrate 500 (or a second substrate), and a sealing member 700.

The display panel 100 may have a rectangular plane shape having shorter sides in the first direction DR1 and longer sides in the second direction DR2 intersecting the first direction DR1. Each of the corners where the shorter sides in the first direction DR1 meet the longer sides in the second direction DR2 may be rounded or may be a right angle. The shape of the display panel 100 when viewed from the top (i.e., in a plan view) is not limited to a quadrangular shape, but may be a different polygonal shape, a circular shape, or an elliptical shape in another exemplary embodiment.

The display panel 100 may be flat, but the display panel 100 according to the invention is not limited thereto. In another exemplary embodiment, for example, the display panel 100 may include curved portions in at left and right ends and have a constant curvature or varying curvatures. In addition, the display panel 100 may be flexible such that it can be curved, bent, folded or rolled.

The display panel 100 may include a display area DPA and non-display areas NDA. In the display area DPA, images can be displayed. In the non-display areas NDA, images are not displayed. The display area DPA may be referred to as an active area, while the non-display areas NDA may be referred to as an inactive area. The display area DPA may generally occupy the center of the display panel 100.

The display area DPA may include a plurality of pixels PX. The plurality of pixels PX may be arranged in a matrix when viewed from the top. The shape of each pixel PX may be, but is not limited to, a rectangle or a square when viewed from the top. Each pixel may have a diamond shape having sides inclined with respect to a horizontal direction. The stripe-type pixels PX and pentile-type pixels may be arranged alternately. Each of the pixels PX may include one or more light-emitting elements EL (see FIG. 5) that emit light of particular wavelength bands to represent colors.

The non-display areas NDA may be disposed around the display area DPA. The non-display areas NDA may surround the display area DPA entirely or partially. The display area DPA may have a rectangular shape, and the non-display areas NDA may be disposed to be adjacent to the four sides of the display area DPA. The non-display areas NDA may form the bezel of the display panel 100. Lines or circuit drivers included in the display panel 100 or external devices may be disposed in the non-display area NDA.

The display driver 200 outputs signals and voltages for driving the display panel 100. For example, the display driver 200 may apply data voltages to the data lines. In addition, the display driver 200 may apply driving voltages to driving voltage lines and may apply scan control signals to the scan driver. The display driver 200 may be implemented as an integrated circuit ("IC") and may be attached to the display circuit board 300. Alternatively, the display driver 200 may be bonded to the display panel 100 by chip-on-glass ("COG") technique, chip-on-plastic ("COP") technique, or ultrasonic bonding.

The display circuit board 300 may be disposed in the non-display areas NDA at one edge of the display panel 100. For example, the display circuit board 300 may be disposed in the non-display area NDA at the lower edge of the display panel 100 as shown in FIG. 2. The display circuit board 300 may be bent such that it is disposed on the lower surface of the display panel 100, and one edge of the display circuit board 300 may be attached to the lower surface of the display panel 100. Although not shown in the drawings, the display circuit board 300 may be attached to and fixed to the lower surface of the display panel 100 through an adhesive member. The adhesive member may be a pressure-sensitive adhesive. Alternatively, the display circuit board 300 may be eliminated, and one edge of the display panel 100 may be bent downward.

The display circuit board 300 may be attached on the display pads of the display panel 100 using an anisotropic conductive film. Accordingly, the display circuit board 300 may be electrically connected to the display pads of the display panel 100. The display circuit board 300 may be a flexible printed circuit board, a printed circuit board, or a flexible film such as a chip on film.

The encapsulation substrate 500 (or second substrate) is disposed on the display panel 100. For example, the encapsulation substrate 500 may be disposed to be spaced apart from and face the display panel 100 in the third direction DR3. The area of the encapsulation substrate 500 may be smaller than the area of the display panel 100 when viewed from the top, but it may cover at least the display area DPA of the display panel 100. It is, however, to be understood that the present disclosure is not limited thereto. In another exemplary embodiment, the area of the encapsulation substrate 500 may be substantially equal to the area of the display panel 100 when viewed from the top. The encapsulation substrate 500 may encapsulate the light-emitting elements EL and circuit elements disposed on the display panel 100 together with the sealing member 700 to be described later. In addition, in some exemplary embodiments, a touch member, a polarizing member, etc. may be further disposed on the encapsulation substrate 500.

In an exemplary embodiment, the encapsulation substrate 500 may be a transparent plate or a transparent film. For example, the encapsulation substrate 500 may include a glass material, a quartz material, etc. In some exemplary embodiments, the encapsulation substrate 500 is spaced apart from the light-emitting element EL, and the space between them may be filled with an inert gas such as nitrogen gas. It is, however, to be understood that the present disclosure is not limited thereto. In another exemplary embodiment, the space between the encapsulation substrate 500 and the light-emitting element EL may be filled with a filler, or the like.

The sealing member 700 may be disposed between the display panel 100 and the encapsulation substrate 500. For example, the sealing member 700 may be disposed in the non-display areas NDA of the display panel 100 to surround the display area DPA, and may encapsulate the light-emitting elements EL and the circuit elements together with the encapsulation substrate 500. The sealing member 700 may seal the space between the encapsulation substrate 500 and the display panel 100. The space may be in a vacuum state by removing moisture or air during the process of fabricating the display device 10. The sealing member 700 can prevent damage to the light-emitting element EL due to air or moisture, together with the encapsulation substrate 500.

The sealing member 700 may couple the display panel 100 with the encapsulation substrate 500. The sealing member 700 may be disposed on a metal line layer MTL disposed in the non-display area NDA of the display panel 100, and may be in contact with and coupled with the metal line layer MTL and the lower surface of the encapsulation substrate 500. It is, however, to be understood that the present disclosure is not limited thereto. In another exemplary embodiment, the sealing member 700 may not be in contact with the metal line layer MTL of the display panel 100 and may couple the display panel 100 with the encapsulation substrate 500 where the metal line layer MTL is not disposed.

In some exemplary embodiments, the sealing member 700 may be cured frit. As used herein, frit may refer to a structure having glass properties formed by melting and curing a powder glass to which an additive is selectively added. The frit may be formed by disposing powder glass between the display panel 100 and the encapsulation substrate 500 and then performing a firing and melting process such that the display panel 100 is coupled with the encapsulation substrate 500. In the following description, the sealing member 700 is cured frit as an example.

Since the sealing member 700 is formed via a firing and melting process during the process of fabricating the display device 10, the display panel 100 and the encapsulation substrate 500 may be coupled with each other by the physical bonding with the sealing member 700. According to an exemplary embodiment of the present disclosure, the display device 10 may include a fused region without a physical boundary at the boundary between the sealing member 700 and the encapsulation substrate 500 or between the sealing member 700 and the display panel 100. The sealing member 700 may be fused and bonded at least with the encapsulation substrate 500. Accordingly, at the boundaries with the display panel 100 and the encapsulation substrate 500, there may be physical boundaries and fused regions without a physical boundary. As the display device 10 includes the fused regions, the sealing member 700 can be combined with the display panel 100 and the encapsulation substrate 500 with a stronger bonding force.

However, if the fused regions overlap with metal lines disposed in the display panel 100, there may be a problem that the metal lines to which electrical signals are applied are disconnected or damaged. According to an exemplary embodiment of the present disclosure, the display device 10 may include patterns that are formed in the encapsulation substrate 500 and guide the fused regions to be formed only at particular locations. As the encapsulation substrate 500 includes the patterns, and the fused regions between the display panel 100 and the sealing member 700 and between the encapsulation substrate 500 and the sealing member 700 may be selectively formed only where the patterns are not located. The patterns formed in the encapsulation substrate 500 may be aligned such that they overlap the metal lines of the display panel 100 in a plan view (i.e., in the thickness direction of the display panel), and the fused regions may be formed such that they do not overlap with the metal lines. Accordingly, it is possible to prevent damage to the metal lines of the display panel 100 of the display device 10 and to bond the display panel 100 with the encapsulation substrate 500 with a stronger force. As a result, the durability of the display device 10 against external impact can be improved. A more detailed description thereon will be given below.

Figure 4:
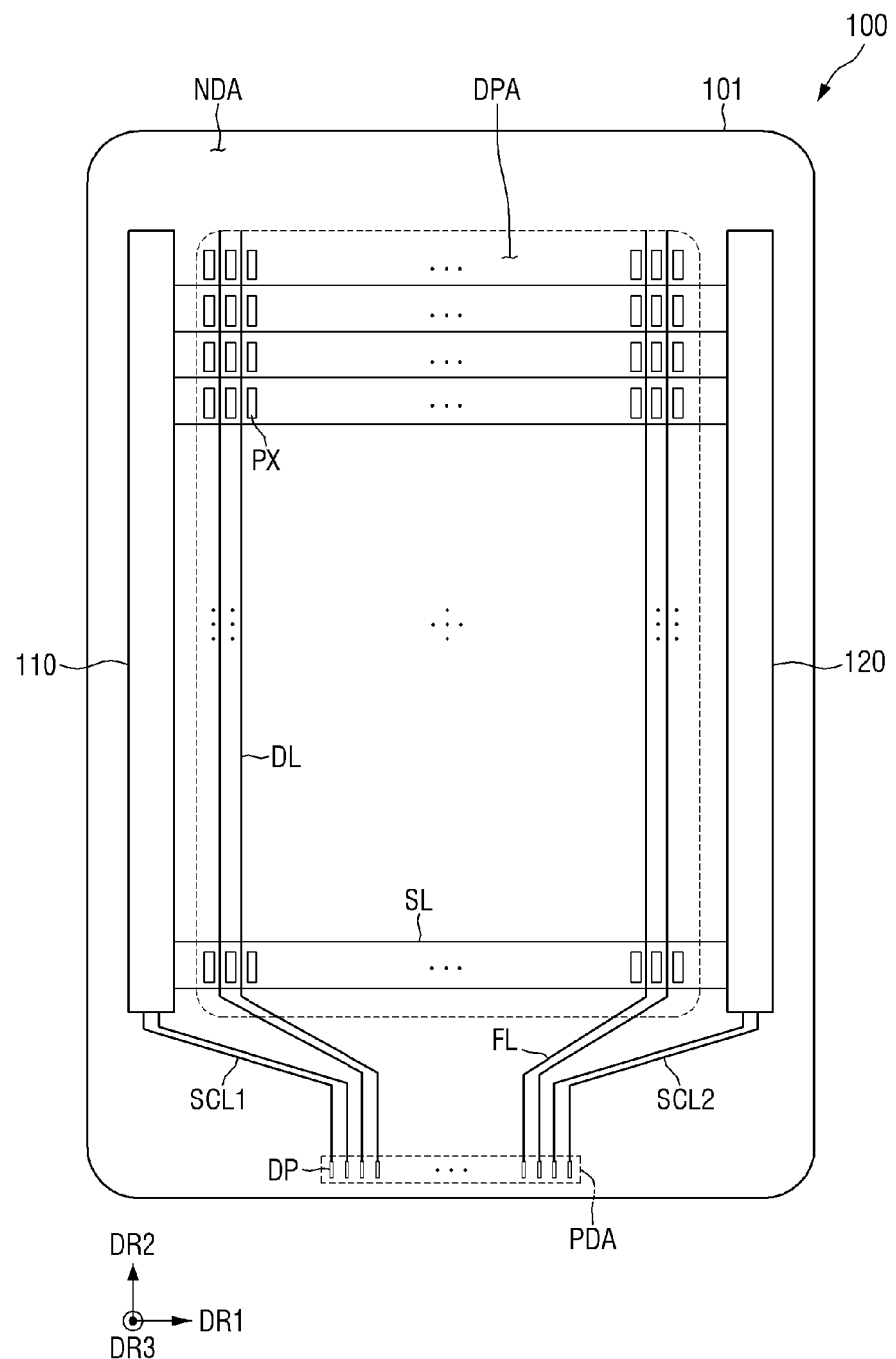
FIG. 4 is a plan view schematically showing a display panel according to an exemplary embodiment of the present disclosure.

FIG. 4 is a plan view schematically showing a display panel according to an exemplary embodiment of the present disclosure.

For convenience of illustration, FIG. 4 shows only the pixels PX, scan lines SL, data lines DL, first scan control lines SCL1, second scan control lines SCL2, a first scan driver 110, a second scan driver 120, pad area PDA, display pads DP and fan-out lines FL of the display panel 100.

Referring to FIG. 4, the display panel 100 may include the display area DPA where pixels PX are formed to display images, and the non-display area NDA which is the peripheral area of the display area DA. The non-display area NDA may be defined as the area from the outer side of the display area DPA to the edge of the display panel 100.

The scan lines SL, the data lines DL and the pixels PX may be disposed in the display area DPA. The scan lines SL may be arranged in the first direction DR1, while the data lines DL may be arranged in the second direction DR2 intersecting the first direction DR1.

Each of the pixels PX may be connected to at least one of the scan lines SL and at least one of the data lines DL. Each of the pixels PX may include thin-film transistors including a driving transistor and at least one switching transistor, an organic light-emitting diode, and a capacitor. When a scan signal is applied from the scan line SL, each of the pixels PX receives a data voltage of the data line DL and supplies a driving current to the organic light-emitting diode according to the data voltage applied to the gate electrode of the driving transistor, such that light is emitted. The structure of the elements arranged in the pixel PX will be described in detail later with reference to FIG. 5.

The first scan driver 110, the second scan driver 120, the display driver 200 (See FIG. 1), the first scan control lines SCL1, the second scan control lines SCL2 and the fan-out lines FL may be disposed in the non-display area NDA.

The first scan driver 110 may be connected to the display driver 200 through the first scan control lines SCL1. Therefore, the first scan driver 110 may receive the first scan control signal of the display driver 200. The first scan driver 110 generates scan signals according to the first scan control signal and supplies them to the scan lines SL.

The second scan driver 120 may be connected to the display driver 200 through the second scan control lines SCL2. Therefore, the second scan driver 120 may receive the second scan control signal of the display driver 200. The second scan driver 120 generates scan signals according to the second scan control signal and supplies them to the scan lines SL.

The first scan driver 110 may be connected to the scan lines SL connected to the pixels PX of the display area DPA. The second scan driver 120 may be connected to the scan lines SL connected to the pixels PX.

The fan-out lines FL connect the display pads DP with the data lines DL, the first scan driver 110, and the second scan driver 120. Specifically, the fan-out lines FL may be disposed between the display pad DP and the data lines DL, between the display pad DP and the first scan driver 110, and between the display pad DP and the second scan driver 120.

The pad area PDA may include display pads DP. The display pad area PDA may be disposed at one edge of the substrate 101. For example, the pad area PDA may be disposed on the lower edge of the substrate 101.

Figure 5:
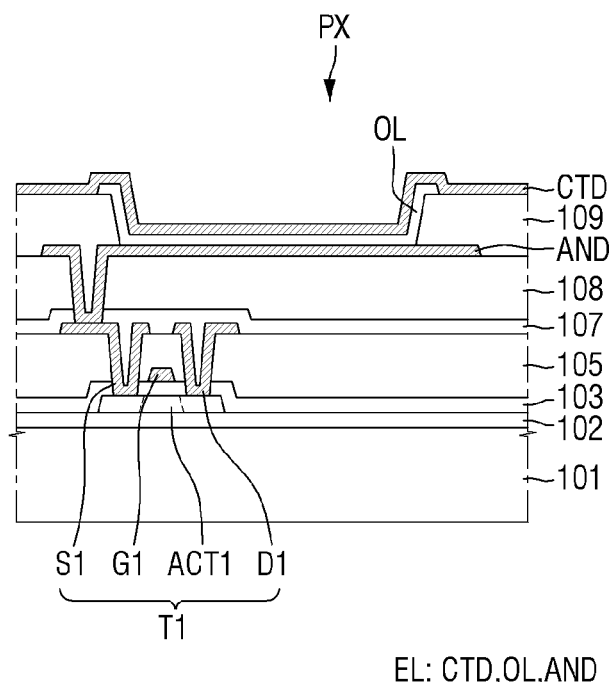
FIG. 5 is a cross-sectional view showing one pixel of FIG. 4.

FIG. 5 is a cross-sectional view showing one pixel of FIG. 4.

Referring to FIG. 5, the display panel 100 may include a base substrate 101, a thin-film transistor T1 and a light-emitting element EL disposed on the base substrate 101. Each of the pixels PX of the display panel 100 may include at least one thin-film transistor T1 and a light-emitting element EL, and may be connected to the above-described scan line SL and data line DL. Although one thin-film transistor T1 is disposed in one pixel PX in the example shown in FIG. 5, the present disclosure is not limited thereto.

The base substrate 101 may be a rigid substrate. The base substrate 101 may be made of or include an insulating material such as glass, quartz and a polymer resin. The examples of the polymer material may be polyethersulphone ("PES"), polyacrylate ("PA"), polyacrylate ("PAR"), polyetherimide ("PEI"), polyethylenenapthalate ("PEN"), polyethyleneterephtalate ("PET"), polyphenylenesulfide ("PPS"), polyallylate, polyimide ("PI"), polycarbonate ("PC"), cellulosetriacetate ("CAT"), cellulose acetate propionate (CAP), or combinations thereof. The base substrate 101 may include a metallic material.

A buffer layer 102 may be disposed on the base substrate 101. The buffer layer 102 may be formed on the base substrate 101 to protect the thin-film transistors T1 and the light-emitting elements from moisture permeating through the base substrate 101 that is susceptible to moisture permeation. The buffer layer 102 may be formed of or include a plurality of inorganic films stacked on one another alternately. For example, the buffer layer 102 may be made up of or include multiple films in which one or more inorganic materials of a silicon oxide (SiOx), a silicon nitride (SiNx) and a silicon oxynitride (SiON) are stacked on one another alternately. In another exemplary embodiment, the buffer layer 102 may be eliminated.

On the buffer layer 102, the thin-film transistors T1 is disposed. Each of the thin-film transistors T1 may include an active layer ACT1, a gate electrode G1, a source electrode S1, and a drain electrode D1. In FIG. 5, the thin-film transistor T1 is implemented as a top-gate transistor in which the gate electrode G1 is located above the active layer ACT1. It is, however, to be understood that the present disclosure is not limited thereto. That is to say, in another exemplary embodiment, the thin-film transistors T1 may be implemented as bottom-gate transistors in which the gate electrode G1 is located below the active layer ACT1, or as double-gate transistors in which the gate electrodes G1 are disposed above and below the active layer ACT1, respectively.

The active layer ACT1 is disposed on the buffer layer 102. The active layer ACT1 may be made of or include a silicon-based semiconductor material or an oxide-based semiconductor material. Although not shown in the drawings, a light-blocking layer for blocking external light incident on the active layer ACT1 may be disposed between the buffer layer 102 and the active layer ACT1.

A gate insulating layer 103 may be disposed on the active layer ACT1. The gate insulating layer 103 may be an inorganic layer, e.g., multiple films in which one or more inorganic materials of a silicon oxide (SiOx), a silicon nitride (SiNx) and a silicon oxynitride (SiON) are stacked on one another alternately.

The gate electrode G1 and a gate line may be disposed on the gate insulating layer 103. The gate electrode G1 and the gate line may be made up of or include a single layer or multiple layers of one of molybdenum (Mo), aluminum (Al), chromium (Cr), gold (Au), titanium (Ti), nickel (Ni), neodymium (Nd) and copper (Cu) or an alloy thereof.

An interlayer dielectric layer 105 may be disposed over the gate electrodes G1 and the gate line. The interlayer dielectric layer 105 may be an inorganic layer, e.g., multiple films in which one or more inorganic materials of a silicon oxide (SiOx), a silicon nitride (SiNx) and a silicon oxynitride (SiON) are stacked on one another alternately.

The source electrode S1, the drain electrode D1, and a data line may be disposed on the interlayer dielectric layer 105. Each of the source electrode S1 and the drain electrode D1 may be connected to the active layer ACT1 through a contact hole penetrating through the gate insulating layer 103 and the interlayer dielectric layer 105. The source electrode S1, the drain electrode D1, and the data line may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A protective layer 107 may be disposed on the source electrode S1, the drain electrode D1, and the data line in order to insulate the thin-film transistor T1. The protective layer 107 may be an inorganic layer, e.g., multiple films in which one or more inorganic materials of a silicon oxide (SiOx), a silicon nitride (SiNx) and a silicon oxynitride (SiON) are stacked on one another alternately. A planarization layer 108 is disposed on the protective layer 107. The planarization layer 108 may provide a flat surface over the level difference of the thin-film transistor T1. The planarization layer 108 may be formed of or include an organic layer such as an acryl resin, an epoxy resin, a phenolic resin, a polyamide resin, and a polyimide resin.

A bank layer 109 and a light-emitting element EL are disposed on the planarization layer 108.

The light-emitting element EL may be an organic light-emitting device. In such case, the light-emitting element EL may include an anode electrode AND, emissive layers OL, and a cathode electrode CTD.

The anode electrode AND may be disposed on the planarization layer 108. The anode electrode AND may be connected to the source electrode S1 of the thin-film transistor T1 through a contact hole penetrating through the protective layer 107 and the planarization layer 108.

The bank layer 109 may cover the edge of the anode electrode AND on the planarization layer 108 in order to separate the pixels from one another. That is to say, the bank layer 109 serves to define the pixels. In each of the pixels, the anode electrode AND, the emissive layer OL and the cathode electrode CTD are sequentially stacked on one another such that holes from the anode electrode AND and electrons from the cathode electrode CTD combine in the emissive layer OL to emit light.

The emissive layers OL are disposed on the anode electrode AND and the bank layer 109. The emissive layers OL may be organic emissive layers. The emissive layer OL may emit one of red light, green light, and blue light. Alternatively, the emissive layer OL may be a white emissive layer that emits white light. In such case, the red emissive layer, the green emissive layer, and the blue emissive layer may be stacked on one another or may be disposed commonly across the pixels as a common layer. In such case, the display panel 100 may further include additional color filters for representing red, green, and blue colors.

The emissive layer OL may include a hole transporting layer, a light-emitting layer, and an electron transporting layer. In addition, the emissive layer OL may have a tandem structure of two or more stacks, in which case a charge generating layer may be disposed between the stacks.

The cathode electrode CTD is disposed on the emissive layer OL. The cathode electrode CTD may be disposed to cover the emissive layer OL. The cathode electrode CTD may be a common layer disposed across the pixels.

When the light-emitting element EL of the display panel 100 is of a top-emission type in which light exits toward the upper side, the anode electrode AND may be made of or include a metal material having a high reflectivity such as a stack structure of aluminum and titanium (Ti/Al/Ti), a stack structure of aluminum and ITO ("ITO"/Al/ITO), an Ag—Pd—Cu ("APC") alloy and a stack structure of APC alloy and ITO (ITO/APC/ITO). The APC alloy is an alloy of silver (Ag), palladium (Pd) and copper (Cu). The cathode electrode CTD may be formed of or include a transparent conductive material (TCP) such as ITO and IZO that can transmit light, or a semi-transmissive conductive material such as magnesium (Mg), silver (Ag) and an alloy of magnesium (Mg) and silver (Ag). When the cathode electrode CTD is formed of or include a semi-transmissive metal material, the light extraction efficiency can be increased by using microcavities.

When the light-emitting element EL is a bottom-emission type in which light exits toward the lower side thereof, the anode electrode AND may be formed of or include a transparent conductive material ("TCP") such as ITO and IZO that can transmit light, or a semi-transmissive conductive material such as magnesium (Mg), silver (Ag) and an alloy of magnesium (Mg) and silver (Ag). The cathode electrode CTD may be made of or include a metal material having a high reflectivity such as a stack structure of aluminum and titanium (Ti/Al/Ti), a stack structure of aluminum and ITO (ITO/Al/ITO), an APC alloy and a stack structure of APC alloy and ITO (ITO/APC/ITO). When the anode electrode AND is formed of or include a semi-transmissive conductive material, the light extraction efficiency can be increased by using microcavities.

Figure 6:
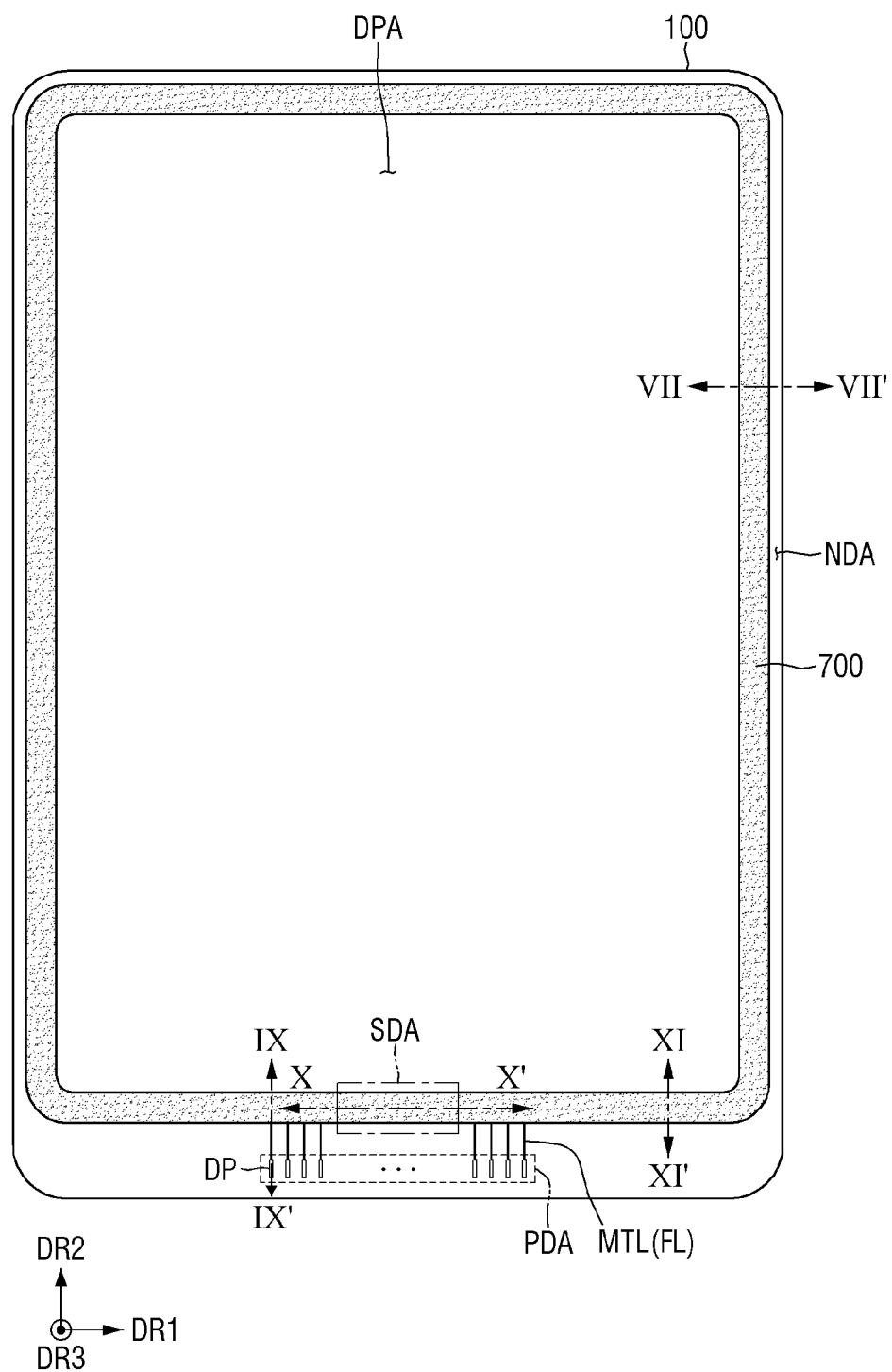
FIG. 6 is a plan view schematically showing a sealing member disposed in a display device according to an exemplary embodiment of the present disclosure.
Figure 7:
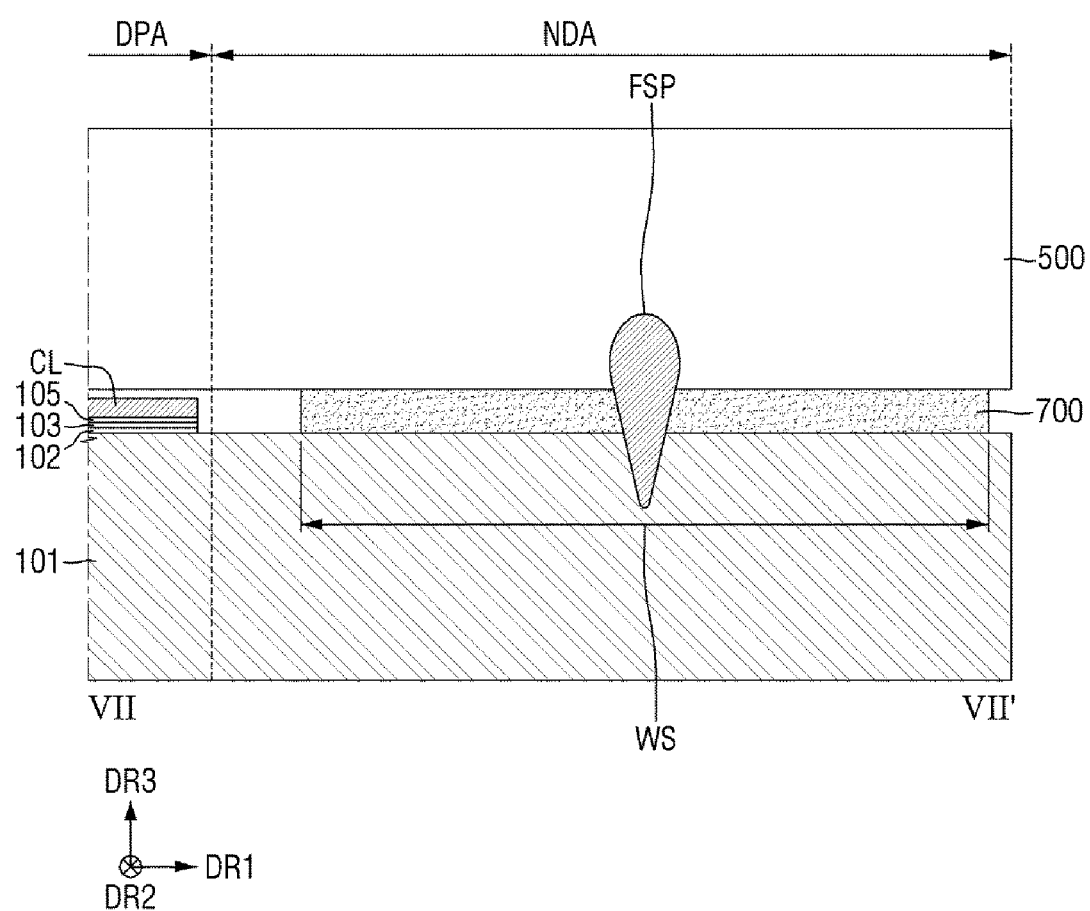
FIG. 7 is a cross-sectional view taken along line VII-VII' of FIG. 6.

FIG. 6 is a plan view schematically showing a sealing member disposed in a display device according to an exemplary embodiment of the present disclosure. FIG. 7 is a cross-sectional view taken along line VII-VII' of FIG. 6. FIG. 7 shows a cross section of a portion of the non-display areas NDA of the display panel 100 that is located in the first direction DR1 of the display area DPA.

Referring to FIGS. 6 and 7, a cell CL including a plurality of circuit elements including the above-described light-emitting element EL is disposed in the display area DPA of the display device 10. The sealing member 700 for bonding the display panel 100 with the encapsulation substrate 500 is disposed in the non-display area NDA. Although a plurality of insulating layers 102, 103 and 105 is disposed in the display area DPA, and the cell CL is disposed on the display area DPA in the drawings, the present disclosure is not limited thereto. The cell CL may be an area in which the pixels PX of the display device 10 are disposed, including the light-emitting element EL described above with reference to FIG. 5. Such elements have been described above; and, therefore, the redundant description will be omitted.

The sealing member 700 of the display device 10 may be disposed in the non-display area NDA to form a closed curve when viewed from the top and may surround the display area DPA of the display panel 100. In other words, the sealing member 700 may surround the light-emitting elements EL disposed in the display area DPA and may seal the space between the encapsulation substrate 500 and the display panel 100. The space may exist in a vacuum state by removing moisture or air during the process of fabricating the display device 10. The sealing member 700 can prevent damage to the light-emitting element EL due to air or moisture together with the encapsulation substrate 500.

The sealing member 700 may be disposed between the base substrate 101 and the encapsulation substrate 500 in the non-display area NDA of the display panel 100. According to an exemplary embodiment of the present disclosure, the sealing member 700 may be in contact with at least a portion of the upper surface of the base substrate 101 and at least a portion of the lower surface of the encapsulation substrate 500. The display panel 100 and the encapsulation substrate 500 of the display device 10 may be coupled with each other through the sealing member 700. FIG. 7 shows another non-display area NDA in which the pad area PDA is not disposed among the non-display areas NDA of the display panel 100, where the sealing member 700 may be disposed directly on the base substrate 101. The sealing member 700 includes a frit and may couple the display panel 100 with the encapsulation substrate 500 by physical boding. There may be physically border between the sealing member 700 and the base substrate 101 of the display panel 100 and between the sealing member 700 and the encapsulation substrate 500.

The display device 10 may include a fusing pattern FSP that is formed as the sealing member 700 is fused with the encapsulation substrate 500 or with the display panel 100 such that there is no physical boundary therebetween. According to an exemplary embodiment of the present disclosure, the fusing pattern FSP may be formed over at least a portion of the boundaries between the sealing member 700 and the display panel 100 and between the sealing member 700 and the encapsulation substrate 500. For example, the fusing pattern FSP may overlap at least the sealing member 700 and may be disposed over a portion of the encapsulation substrate 500, the sealing member 700, and the display panel 100. The fusing pattern FSP may have a height greater than thickness of the sealing member 700, and at least a portion of the fusing pattern FSP may be disposed in the encapsulation substrate 500 and the base substrate 101 of the display panel 100. It is, however, to be understood that the present disclosure is not limited thereto.

According to an exemplary embodiment of the present disclosure, the fusing pattern FSP may be the region where there is no physical boundary between sealing member 700 and the display panel 100 and between the sealing member 700 and the encapsulation substrate 500 as they are fused together. The fusing pattern FSP may be formed as the material of the sealing member 700 is mixed with the material of the display panel 100 or the encapsulation substrate 500. For example, when the sealing member 700 is disposed to be in direct contact with the encapsulation substrate 500 and the base substrate 101 of the display panel 100, the fusing pattern FSP may be formed by mixing the materials of the encapsulation substrate 500 and the base substrate 101 with the material of the sealing member 700.

As described above, the base substrate 101 and the encapsulation substrate 500 may include materials such as glass, and the sealing member 700 may include frit, which is a material similar to the material of the base substrate 101 and the encapsulation substrate 500. The fusing pattern FSP may be formed as a portion of the material of the sealing member 700 introduced into the encapsulation substrate 500 and the base substrate 101 is mixed with a portion of the material of the encapsulation substrate 500 and the base substrate 101 introduced into the sealing member 700. Accordingly, there may be no physical boundary at the interface between the upper surface of the sealing member 700 and the lower surface of the encapsulation substrate 500 in the fusing pattern FSP. In addition, there may be no physical boundary at the interface between the lower surface of the sealing member 700 and the upper surface of the base substrate 101 in the fusing pattern FSP. The sealing member 700, the encapsulation substrate 500 and the display panel 100 are fused and the materials of them are mixed to form the fusing pattern FSP, such that the bonding force between the display panel 100 and the encapsulation substrate 500 can be enhanced. Although only one fusing pattern FSP is shown in the width direction (i.e., the first direction DR1) of the sealing member 700 in FIG. 7, the present disclosure is not limited thereto. A plurality of fusing patterns FSP may be formed along the width direction of the sealing member 700, and they may be spaced apart from one another in another exemplary embodiment. The fusing pattern FSP will be described in detail later with reference to other drawings.

FIG. 7 shows a portion of the non-display area NDA of the display panel 100 where the metal line layer MTL is not disposed, and the sealing member 700 is disposed directly on the base substrate 101. It is, however, to be understood that the present disclosure is not limited thereto. At least one metal line layer MTL may be disposed in the non-display area NDA of the display panel 100, and at least a portion of the sealing member 700 may be formed on the metal line layer MTL in another portion of the non-display area NDA.

Figure 8:
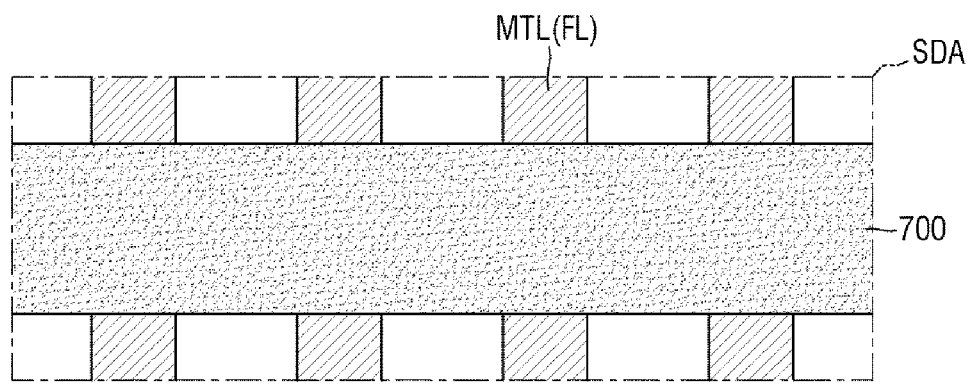
FIG. 8 is an enlarged view of area SDA of FIG. 6.
Figure 9:
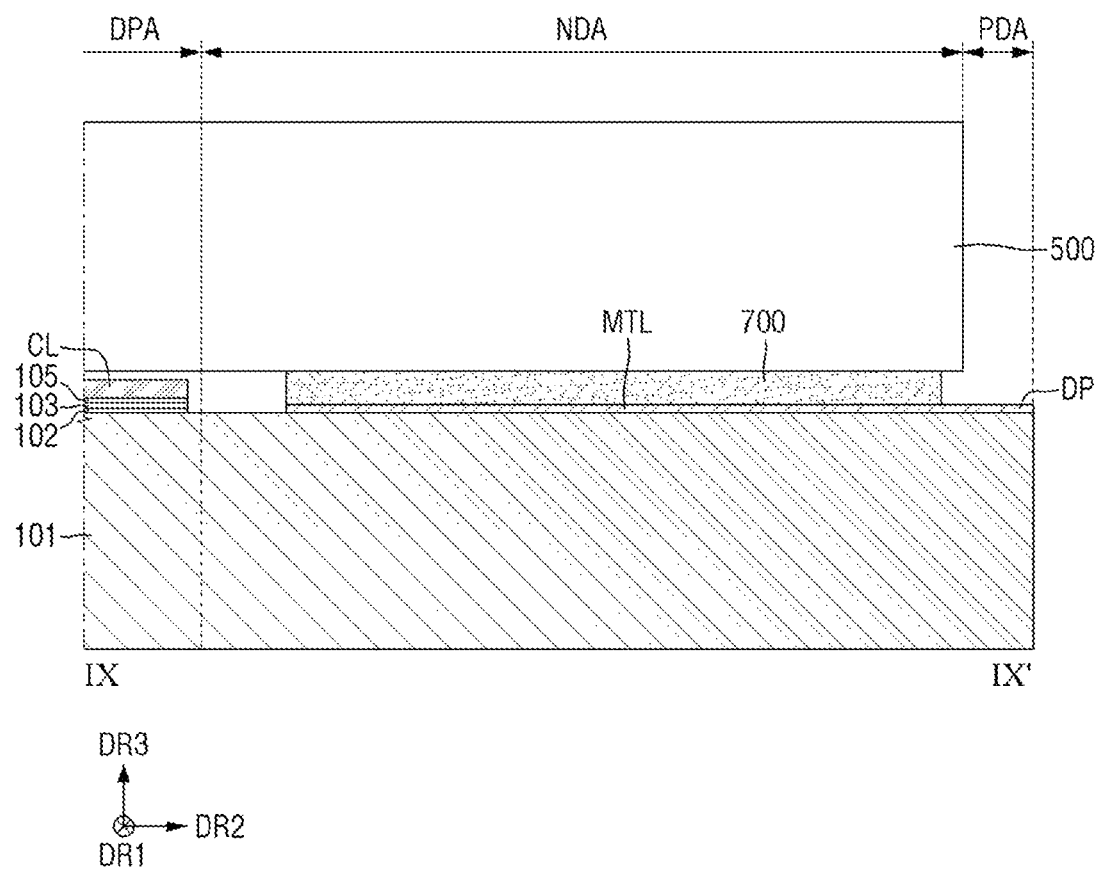
FIG. 9 is a cross-sectional view taken along line IX-IX' of FIG. 6.

FIG. 8 is an enlarged view of area SDA of FIG. 6. FIG. 9 is a cross-sectional view taken along line IX-IX' of FIG. 6. FIGS. 8 and 9 show a plan view and a cross-sectional view of a portion of the non-display area NDA of the display panel 100 adjacent to the pad area PDA on the lower side in the second direction DR2 of the display area DPA, respectively.

Referring to FIGS. 8 and 9, a metal line layer MTL may be disposed on at least some of the non-display areas NDA of the display panel 100, for example, the non-display area NDA adjacent to the pad area PDA. The metal line layer MTL may form a pattern of lines spaced apart from one another in the first direction DR1, and at least a portion of the sealing member 700 may be disposed on the metal line layer MTL. As mentioned earlier, the first scan driver 110, the second scan driver 120, the fan-out line FL, etc. may be disposed in the non-display areas NDA of the display panel 100. The metal line layer MTL of FIG. 8 may be the fan-out line FL disposed in the non-display area NDA, and the sealing member 700 may be disposed to overlap with the fan-out line FL. It is, however, to be understood that the present disclosure is not limited thereto. the metal line layer MTL may be one of the fan-out line FL, the first scan driver 110 and the second scan driver 120, and the sealing member 700 may partially overlap with one of circuit elements or lines disposed in the first scan driver 110 or the second scan driver 120 disposed in the display area NDA.

Although the metal line layer MTL is disposed directly on the base substrate 101 of the display panel 100 in FIG. 9, the present disclosure is not limited thereto. In some exemplary embodiments, at least one insulating layer may be disposed in the non-display area NDA of the display panel 100, and the metal line layer MTL may be disposed on the insulating layer. The sealing member 700 may be disposed between the insulating layer and the encapsulation substrate 500, and at least a portion of the lower surface of the sealing member 700 may be in contact with the insulating layer. More detailed description thereon will be given with reference to another exemplary embodiment.

At least a portion of the lower surface of the sealing member 700 disposed in the non-display area NDA may be in direct contact with the metal line layer MTL. In another portion of the non-display area NDA, the sealing member 700 may further include a portion where there is a physical boundary with the metal line layer MTL, in addition to a portion where there is a physical boundary with the base substrate 101 of the display panel 100. As shown in FIG. 9, the fusing pattern FSP may not be disposed between the sealing member 700 and the display panel 100 and between the sealing member 700 and the encapsulation substrate 500 in some of the non-display area NDA of the display panel 100 where the metal line layer MTL is disposed. The sealing member 700 overlapping the metal line layer MTL may be in direct contact with the encapsulation substrate 500 and the metal line layer MTL to form physical boundaries therebetween.

The display device 10 may include the fusing pattern FSP disposed between the sealing member 700 and the display panel 100 and between the sealing member 700 and the encapsulation substrate 500. The fusing pattern FSP may be formed by mixing the material of the sealing member 700 and a portion of the materials of the display panel 100 and the encapsulation substrate 500. During the process of fabricating the display device 10, if the fusing pattern FSP is formed overlapping the metal line layer MTL of the display panel 100, the material of the metal line layer MTL may be mixed, and thus the metal line layer MTL may be partially disconnected or damaged. As a result, electric signals flowing through the first scan driver 110, the second scan driver 120 and the fan-out line FL may not be transmitted.

In some exemplary embodiments, the metal line layer MTL may be separated into a number of metal layers to form a pattern in the non-display area NDA of the display panel 100. As will be described later, during the process of fabricating the display device 10, the fusing pattern FSP may be formed via a process of irradiating a pulsed laser having a high energy. It is not easy to selectively irradiate a pulsed laser directly onto the region of the sealing member 700 that does not overlap the metal line layer MTL of the display panel 100. Accordingly, if no other way is used, the adjacent metal line layer MTL may be damaged.

Figure 10:
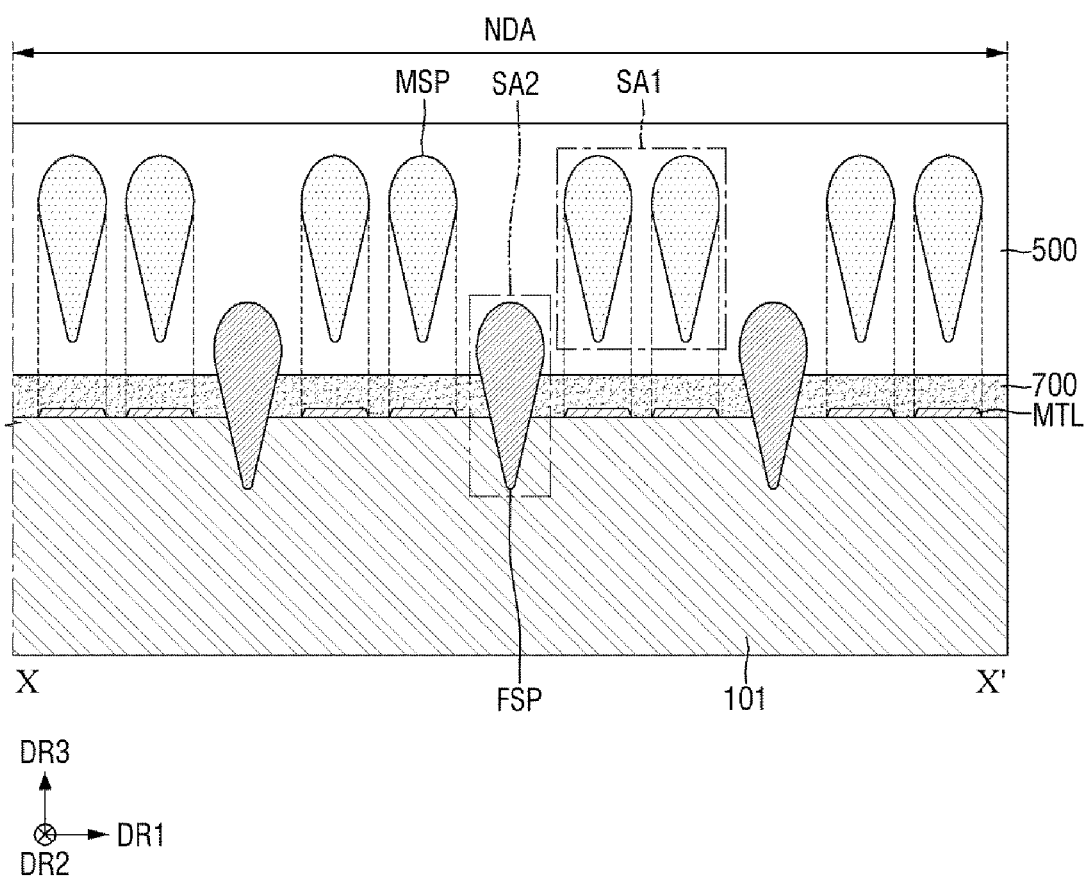
FIG. 10 is a cross-sectional view taken along line X-X' of FIG. 6.

To prevent this, the encapsulation substrate 500 of the display device 10 according to an exemplary embodiment of the present disclosure includes melting patterns MSP that block the transmission of the pulsed laser as shown in FIG. 10. The display device 10 according to an exemplary embodiment includes melting patterns MSP formed in the encapsulation substrate 500 to overlap with the metal line layer MTL overlapping with the sealing member 700 in the non-display area NDA of the display panel 100, and the fusing patterns FSP may be disposed to overlap with neither the melting patterns MSP nor the metal line layer MTL. The melting pattern MSP can prevent the pulsed laser for forming the fusing pattern FSP from being irradiated to the metal line layer MTL during a process of attaching the display panel 100 and the encapsulation substrate 500 together. The fusing pattern FSP may be formed between the sealing member 700 and the display panel 100 and between the sealing member 700 and the encapsulation substrate 500 such that it does not overlap the metal line layer MTL in the thickness direction (i.e., the third direction DR3), and can prevent the metal line layer MTL from being damaged during the process of forming the fusing pattern FSP.

Figure 11:
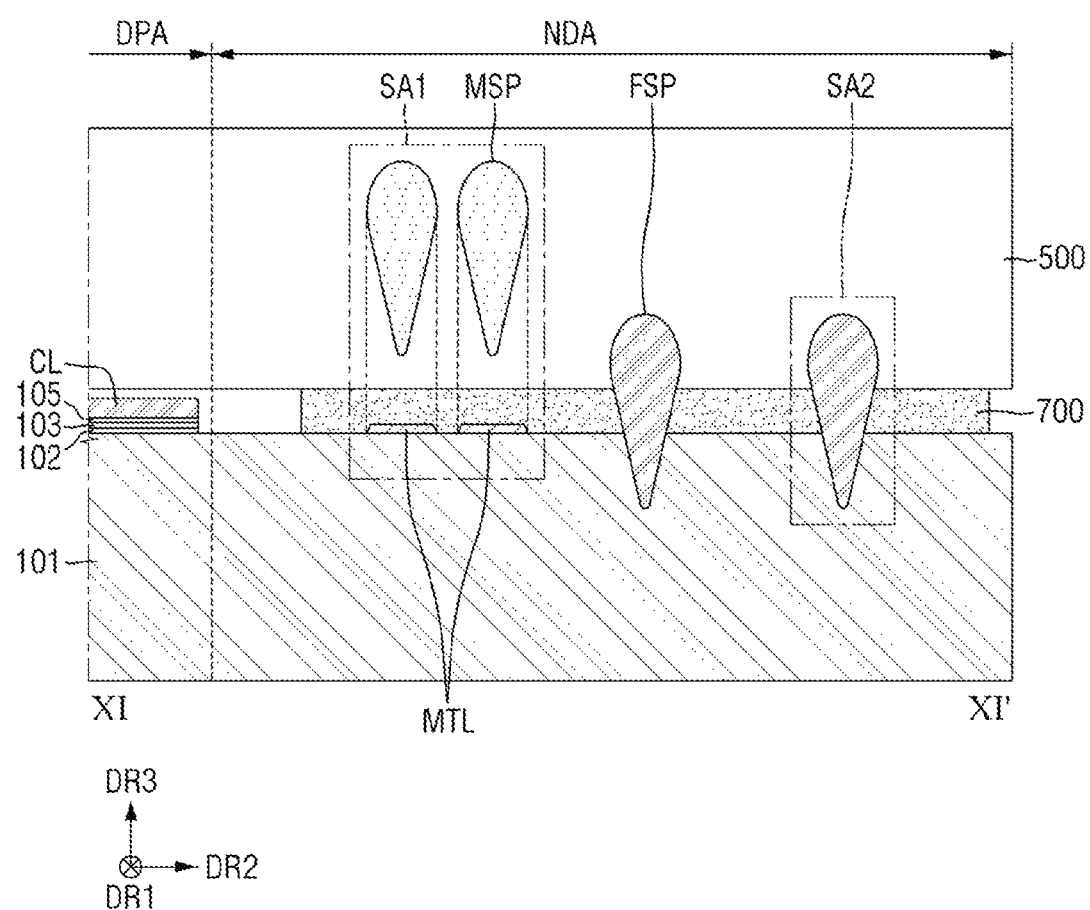
FIG. 11 is a cross-sectional view taken along line XI-XI' of FIG. 6.
Figure 12:
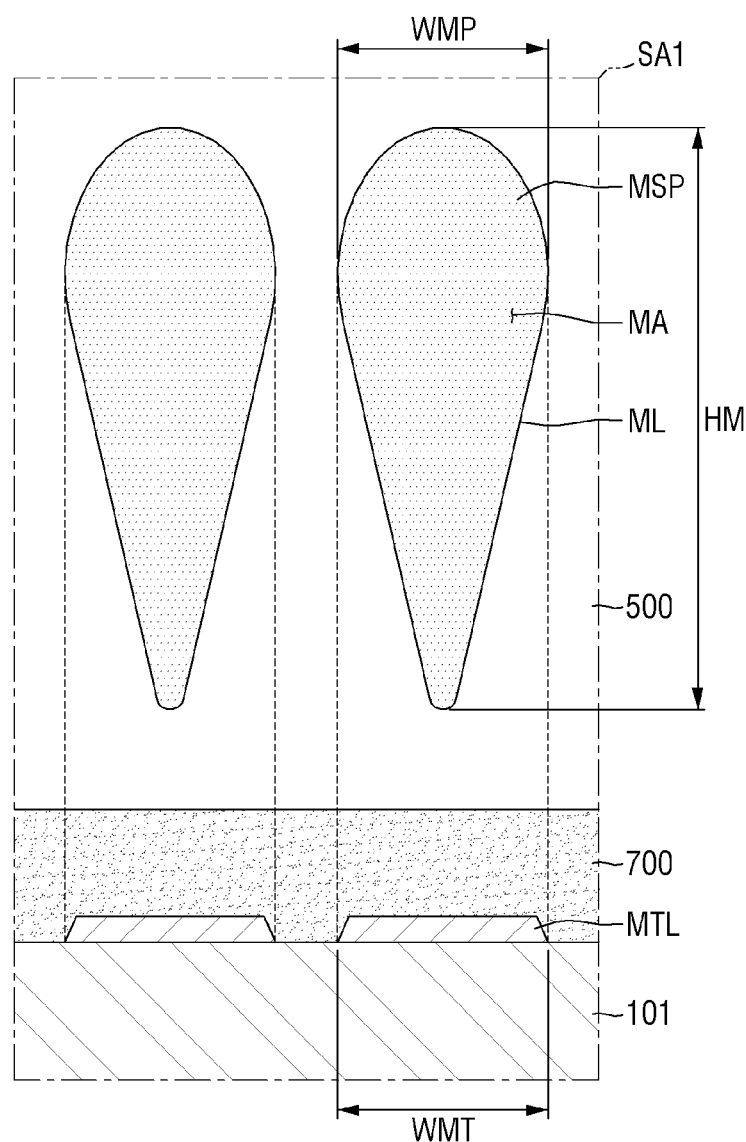
FIG. 12 is an enlarged view of portion SA1 of FIG. 10.
Figure 13:
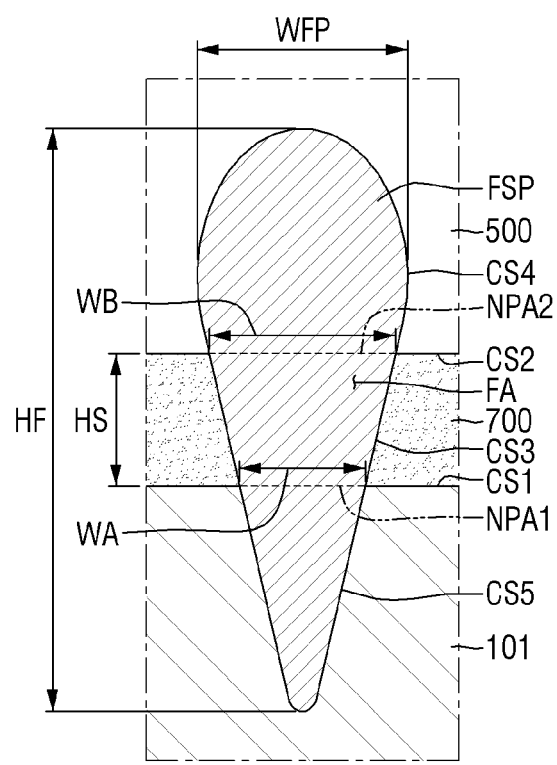
FIG. 13 is an enlarged view of portion SA2 of FIG. 10.

FIG. 10 is a cross-sectional view taken along line X-X' of FIG. 6. FIG. 11 is a cross-sectional view taken along line XI-XI' of FIG. 6. FIG. 12 is an enlarged view of portion SA1 of FIG. 10. FIG. 13 is an enlarged view of portion SA2 of FIG. 10. FIGS. 10 and 11 show cross-sections of a portion of the non-display areas NDA of the display panel 100 where the metal line layer MTL is disposed. FIG. 12 shows melting patterns MSP formed in the encapsulation substrate 500. FIG. 13 shows a fusing pattern FSP disposed in the sealing member 700 between the display panel 100 and the encapsulation substrate 500.

Referring to FIGS. 10 to 13, the encapsulation substrate 500 may include melting patterns MSP disposed in the non-display area NDA. The melting patterns MSP may be formed as some of the materials of the encapsulation substrate 500 are melted and then solidified again. For example, when some regions within the encapsulation substrate 500 are melted via a process of irradiating a pulsed laser onto the encapsulation substrate 500 including a material such as glass, some of the material has fluidity, and glass crystals may have different structure or crystal from the material of the nearby region. The melting pattern MSP formed by solidifying the melted crystal again may include a melting area MA which is a result of some of the material of the encapsulation substrate 500 that has been melted, and a melting interface ML between the melting area MA and the adjacent region outside the melting pattern MSP (see FIG. 12). The melting area MA of the melting pattern MSP is not a region in which a material different from the material of the encapsulation substrate 500 is disposed but may be a region in which some of the materials of the encapsulation substrate 500 are melted and solidified, which has different crystals or structure from the nearby region. The melting interface ML of the melting pattern MSP may not be an interface between the nearby region and the melting area having different material components or a physical interface but may be an interface that is formed as the material of the encapsulation substrate 500 has different crystals or structures.

According to an exemplary embodiment of the present disclosure, the encapsulation substrate 500 includes a transparent material such as glass, and the melting pattern MSP may include the melting area MA and the melting interface ML such that it may have a different refractive index from nearby regions. The pulsed laser irradiated during the process of attaching the display panel 100 and the encapsulation substrate 500 together cannot penetrate the melting patterns MSP due to the difference in refractive index between the melting patterns MSP and the nearby region. However, it can be irradiated onto the sealing member 700 only through the nearby region. According to an exemplary embodiment of the present disclosure, the encapsulation substrate 500 and the display panel 100 may be aligned such that the melting patterns MSP overlap the metal line layer MTL in the non-display area NDA, and the pulsed laser may be irradiated onto only a portion of the sealing member 700 that does not overlap with the melting patterns MSP in a plan view. The fusing pattern FSP formed by the pulsed laser may not overlap with the metal line layer MTL in a plan view, and the bonding force between the display panel 100 and the encapsulation substrate 500 can be enhanced without damage to the metal line layer MLT of the display panel 100.

In addition, the width of the melting patterns MSP in the first direction DR1 may vary along the direction from the lower surface toward the upper surface of the encapsulation substrate 500. According to an exemplary embodiment of the present disclosure, the melting pattern MSP may include a first portion where the melting interface ML is curved and a second portion where the melting interface ML is inclined with respect to the third direction DR3. The melting pattern MSP may have a shape that has the largest width where the first portion meets the second portion, and the width of the melting pattern MSP decreases along a direction toward the other end of each of the first portion and second portion from where the first portion meets the second portion as shown in FIG. 10. As described above, the melting patterns MSP of the encapsulation substrate 500 may be formed via a process of irradiating a pulsed laser. As will be described later, the pulsed laser may be set such that the laser focus is located in a position spaced apart from the lower surface of the encapsulation substrate 500 by a predetermined distance. The area of the melting area MA in a plan view may increase along a direction from the laser focus toward the upper surface of the encapsulation substrate 500. Each of the melting patterns MSP according to an exemplary embodiment may include a first portion having a width increasing along a direction away from the laser focus, and a second portion having a width decreasing along a direction away from the contact position with the first portion. The process of forming the melting patterns MSP will be described in detail later.

According to an exemplary embodiment of the present disclosure, the maximum width WMP of the melting pattern MSP in the second direction DR2 may be equal to or greater than the width WMT of the metal line layer MTL disposed in the non-display area NDA of the display panel 100 such that the melting pattern MSP may completely cover the metal line layer MTL in a plan view. During the process of fabricating the display device 10, the display panel 100 and the encapsulation substrate 500 may be aligned such that the melting pattern MSP overlap the metal line layer MTL, and the melting pattern MSP can prevent the pulsed laser from being irradiated onto the metal line layer MTL. As the maximum width WMP of the melting pattern MSP conforms to the width WMT of the metal line layer MTL taking into account the diagonal interference when the pulsed laser is irradiated, it is possible to prevent the pulsed laser is irradiated directly to the metal line layer MTL, and the fusing patterns FSP do not overlap with the metal line layer MLT. In an exemplary embodiment, the maximum width WMP of the melting pattern MSP may range from about 80 micrometers (μm) to about 120 μm, or from about 90 μm to about 110 μm, and preferably approximately 100 μm. The height HM of the melting pattern MSP may range from about 150 μm to about 220 μm, or about 170 μm to about 200 μm, and preferably may be approximately 180 μm. It is however, to be understood that the maximum width WMP of the melting pattern MSP may be altered in a variety of ways depending on the material or thickness of the metal line layer MTL of the display panel 100 and the encapsulation substrate 500. The above sizes of the melting pattern MSP are merely illustrative, and the present disclosure is not limited thereto.

As will be described later, the melting patterns MSP may be formed via a process of irradiating a pulsed laser. The sizes and shape of the melting pattern MSP may vary depending on the intensity of the pulsed laser or the position of the laser focus. According to another exemplary embodiment of the present disclosure, the pulsed laser for forming the melting pattern MSP may be a laser having a narrow laser width and a strong intensity. In this case, the maximum width WMP of the melting pattern MSP may range from about 8 μm to about 12 μm, or about 9 μm to about 11 μm, and preferably may be approximately 10 μm, and the height HM of the melting pattern MSP may range from about 8 μm to about 22 μm, or about 10 μm to about 20 μm, and preferably approximately about 10 μm. It is, however, to be understood that the present disclosure is not limited thereto.

As described above, the sealing member 700 may include a physical contact at the boundary with the display panel 100 or the metal line layer MTL of the display panel 100 or at the boundary with the encapsulation substrate 500. That is to say, the sealing member 700 may be in contact with the display panel 100 and the encapsulation substrate 500, and there may be physical boundaries where they are in contact with each other. For example, there may be a physical boundary between the lower surface of the encapsulation substrate 500 and the upper surface of the sealing member 700, and between the upper surface of the display panel 100 and the lower surface of the sealing member 700 in the region covered by the melting pattern MSP in a plan view.

The fusing patterns FSP may be formed over at least a portion of the boundaries between the sealing member 700 and the display panel 100 and between the sealing member 700 and the encapsulation substrate 500. The fusing pattern FSP may be the region where there is no physical boundary between sealing member 700 and the display panel 100 and between the sealing member 700 and the encapsulation substrate 500 as they are fused together. The fusing pattern FSP may include a fusing area FA where the material of the sealing member 700 is mixed with the material of the display panel 100 or the encapsulation substrate 500. The materials of the sealing member 700, the encapsulation substrate 500 and the base substrate 101 are mixed in the fusing area FA, and the fusing pattern FSP may include the fusing area FA such that the bonding force between the display panel 100 and the encapsulation substrate 500 can be further enhanced.

The sealing member 700 may include a first boundary surface CS1 forming a physical boundary with the upper surface of the display panel 100 (or the upper surface of the base substrate 101), and a second boundary surface CS2 forming a physical boundary with the lower surface of the encapsulation substrate 500. According to an exemplary embodiment of the present disclosure, the fusing pattern FSP may be formed across the sealing member 700 between the display panel 100 and the encapsulation substrate 500, a third boundary surface CS3 may be formed between the sealing member 700 and the fusing pattern FSP, a fourth boundary surface CS4 may be formed between the encapsulation substrate 500 and the fusing pattern FSP, and a fifth boundary surface CS5 may be formed between the display panel 100 (or the base substrate 101) and the fusing pattern FSP. The first boundary surface CS1 and the second boundary surface CS2 are surfaces where the sealing member 700 is in contact with the display panel 100 and where the sealing member 700 is in contact with the encapsulation substrate 500, respectively, and may be physically divided boundaries in a region outside the fusing pattern FSP. At the first boundary surface CS1 and the second boundary surface CS2, the material of the sealing member 700 does not move to the display panel 100 or the encapsulation substrate 500, or is not mixed with the materials of them. The sealing member 700 may remain bonded to the display panel 100 and the encapsulation substrate 500 at the first boundary surface CS1 and the second boundary surface CS2, respectively.

The fusing pattern FSP may include the fusing area FA where the material of the sealing member 700 is mixed with the material of the encapsulation substrate 500 or the display panel 100. There may be a region NPA1 (see FIG. 13) where no physical boundary is formed on a portion extended from the first boundary surface CS1 in the fusing area FA of the fusing pattern FSP. In addition, there may be a region NPA2 where no physical boundary is formed on a portion extended from the second boundary surface CS2 in the fusing area FA of the fusing pattern FSP. That is to say, the fusing area FA where no physical boundary is formed may be formed on at least a portion of the boundary surface between the sealing member 700 and the display panel 100 or between the sealing member 700 and the encapsulation substrate 500.

The third boundary surface CS3 may be a boundary surface of the fusing pattern FSP in the sealing member 700, The fourth boundary surface CS4 may be a boundary surface of the fusing pattern FSP in the encapsulation substrate 500, and the fifth boundary surface CS5 may be a boundary surface of the fusing pattern FSP in the base substrate 101 of the display panel 100. According to an exemplary embodiment of the present disclosure, unlike the first boundary surface CS1 and the second boundary surface CS2, the third boundary surface CS3 to the fifth boundary surface CS5 of the fusing pattern FSP may not be physical boundaries but may be boundaries between regions having different components depending on the positions. The fusing pattern FSP may be formed as the materials of the base substrate 101 of the display panel 100, the encapsulation substrate 500 and the sealing member 700 are mixed together. As the materials of the base substrate 101, the sealing member 700 and the encapsulation substrate 500 are all included and mixed in the fusing pattern FSP, all of the above materials may be detected in the fusing pattern FSP. For example, the component of the frit of the sealing member 700, which is the first component, and the glass component of the base substrate 101 and the encapsulation substrate 500, which is the second component, may be each detected in the fusing pattern FSP as they are mixed. On the other hand, only the frit component is detected in the sealing member 700, and only the glass component is detected in the base substrate 101 and the encapsulation substrate 500. Accordingly, there may be the boundaries by the component difference in the third boundary surface CS3 to the fifth boundary surface CS5 of the fusing pattern FSP, instead of a physical boundary.

According to an exemplary embodiment of the present disclosure, the fusing pattern FSP may include more content of the second components which are from the encapsulation substrate 500 or the base substrate 101 than the sealing member 700 with respect to the third boundary surface CS3. Similarly, the fusing pattern FSP may include more content of the first components from the sealing member 700 than the encapsulation substrate 500 with respect to the fourth boundary surface CS4, and more content of the first components from the sealing member 700 than the base substrate 101 with respect to the fifth boundary surface CS5. It is to be noted that there may be no physical boundary along the third boundary surface CS3 to the fifth boundary surface CS5, because the base substrate 101, the sealing member 700 and the encapsulation substrate 500 contain the common components with the fusing pattern FSP.

These fusing patterns FSP may be formed as the sealing member 700, the display panel 100 and the encapsulation substrate 500 are partially fused by the pulsed laser irradiated from above the encapsulation substrate 500 during the process of fabricating the display device 10. As will be described later, the pulsed laser may be set such that the laser focus is located inside the display panel 100, and the materials may be mixed at the boundaries between the display panel 100 and the sealing member 700 and between the encapsulation substrate 500 and the sealing member 700. A more detailed description thereon will be given below.

As described above, the pulsed laser irradiated during the process of forming the fusing pattern FSP cannot penetrate the melting patterns MSP disposed in the encapsulation substrate 500 but can pass between the melting patterns MSP to reach between the display panel 100 and the encapsulation substrate 500. Since the encapsulation substrate 500 is disposed such that the melting patterns MSP overlap the metal line layer MTL, the fusing pattern FSP may not overlap with the metal line layer MTL in the thickness direction. The fusing patterns FSP may be spaced apart from the metal line layer MTL and thus may not be in contact with it.

The display device 10 according to the exemplary embodiment of the present disclosure includes the fusing patterns FSP where no physical boundary is formed at the boundaries between the sealing member 700 and the encapsulation substrate 500 and between the display panel 100 and the sealing member 700, and thus the bonding force between the display panel 100 and the encapsulation substrate 500 can be enhanced without damaging the metal line layer MTL disposed on the display panel 100.

The fusing patterns FSP may have a shape substantially similar to the melting patterns MSP. The fusing pattern FSP may have a shape extended in the thickness direction of the display device 10, and its width may vary in a direction from the display panel 100 toward the encapsulation substrate 500. According to an exemplary embodiment of the present disclosure, the fusing pattern FSP may include a first portion overlapping the display panel 100, a second portion overlapping the sealing member 700, and a third portion overlapping the encapsulation substrate 500. The maximum width of the third portion may be greater than the maximum width of each of the first portion and the second portion. In addition, the maximum width of the second portion may be greater than the maximum width of the first portion. The fusing pattern FSP may include a first portion in the display panel 100 where the fifth boundary surface CS5 is inclined, and a second portion in the sealing member 700 where the third boundary surface CS3 is inclined. In addition, the fusing pattern FSP may include a third portion in the encapsulation substrate 500 where the fourth boundary surface CS4 is curved.

As described above, the fusing pattern FSP may be formed by mixing the materials of the sealing member 700, the display panel 100 or the base substrate 101, and the encapsulation substrate 500. According to an exemplary embodiment of the present disclosure, the second portion of the fusing pattern FSP may include the material of the encapsulation substrate 500 or the base substrate 101. In addition, the first portion and the second portion of the fusing pattern FSP may include the material of the sealing member 700. The fusing pattern FSP may include the portions in the sealing member 700, the encapsulation substrate 500 and the display panel 100, respectively, and each of the portions may include the material different from the material of the respective elements.

Similar to the shape of the melting pattern MSP, the pulsed laser forming the melting pattern FSP is set such that the laser focus is located within the display panel 100, and the melting pattern FSP may have a shape with a maximum width increasing from the first portion toward the third portion. The maximum width of the first portion of the fusing pattern FSP may be the width WA of the region NPA1 where the sealing member 700 and the display panel 100 come into contact with each other and there is no physical boundary. The maximum width of the second portion may be the width WB of the region NPA2 where the sealing member 700 and the encapsulation substrate 500 come into contact with each other and there is no physical boundary. Since the first portion is located closer to the laser focus than the second portion is, the maximum width WA of the first portion may be smaller than the maximum width WB of the second portion. The maximum width of the third portion may be the maximum width WFP of the fusing pattern FSP, and the third portion is located farther from the laser focus than the second portion is, and thus the maximum width WFP may be larger than the maximum width WB of the second portion.

According to an exemplary embodiment of the present disclosure, the pulsed laser forming the fusing pattern FSP and the melting pattern MSP may have the same intensity, and the fusing pattern FSP and the melting pattern MSP may have substantially the same shape. The fusing pattern FSP may include the first portion and the second portion having a width that increases in a direction away from the laser focus, and the third portion having a width that increases in a direction away from the laser focus to the position of the maximum width WFP and decreases thereafter. It is to be noted that there is a difference in that the fusing pattern FSP includes the fusing area FA where the materials of the display panel 100, the sealing member 700 and the encapsulation substrate 500 are mixed, while the melting pattern MSP includes the melting area MA formed as the material of the encapsulation substrate 500 is melted and solidified again. A more detailed description of the process of forming the fusing pattern FSP and the melting pattern MSP will be described later.

The maximum width WFP and the height HF of the fusing pattern FSP may be variously changed depending on the thickness HS of the sealing member 700 in the third direction DR3. According to an exemplary embodiment of the present disclosure, the height of the fusing pattern FSP may be greater than the thickness HS of the sealing member 700.

In an exemplary embodiment, the thickness HS of the sealing member 700 may range from about 4.5 μm to about 6 μm, or may be approximately 5 μm. The height HF of the fusing pattern FSP may range from about 150 μm to about 220 μm, or about 170 μm to about 200 μm, and preferably may be approximately 180 μm. The maximum width WFP of the fusing pattern FSP may range from about 80 μm to about 120 μm, or about 90 μm to about 110 μm, and preferably may be approximately 100 μm. However, the maximum width WFP of the fusing pattern FSP may vary depending on the distance between the display panel 100 and the encapsulation substrate 500 or the material or thickness of the sealing member 700. The sealing member 700 may have a width WS in the first direction DR1 (See FIG. 7) in the range of about 500 μm to about 600 μm. A plurality of fusing patterns FSP may be arranged in the width WS direction of the sealing member 700. The above sizes of the fusing pattern FSP is merely illustrative, and the present disclosure is not limited thereto.

As described above, the fusing patterns FSP may be formed via a process of irradiating substantially the same pulsed laser as the melting patterns MSP. According to another exemplary embodiment of the present disclosure, the pulsed laser for forming the fusing pattern FSP may be a laser having a narrow laser width and a strong intensity. Therefore, in this case, the maximum width WMP of the fusing pattern FSP may range from about 8 μm to about 12 μm, or about 9 μm to about 11 μm, preferably may be approximately about 10 μm, and the height HM of the fusing pattern FSP may range from about 8 μm to about 22 μm, or about 10 μm to about 20 μm, preferably approximately about 10 μm. It is, however, to be understood that the present disclosure is not limited thereto.

The sealing member 700 may be formed along the non-display areas NDA of the display panel 100 to form a closed curve to surround the display area DPA. The fusing patterns FSP may be disposed along the sealing member 700 and may be formed spaced apart from one another where the metal line layer MTL is not located. Incidentally, the melting patterns MSP may be selectively formed only in the non-display area NDA of the display panel 100 in the encapsulation substrate 500 where the metal line layer MTL is disposed, to form the melting pattern area MPA (see FIG. 14).

Figure 14:
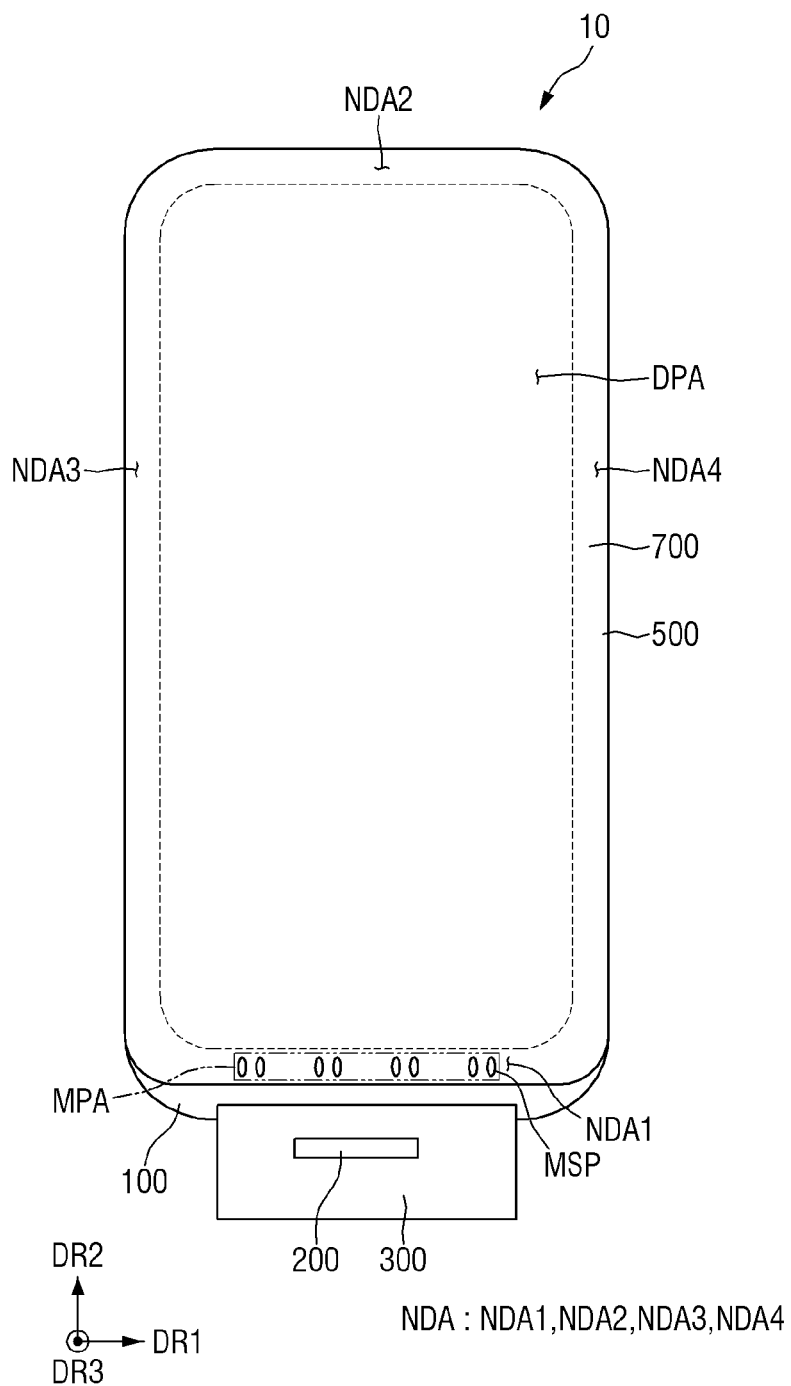
FIG. 14 is a plan view showing an arrangement of melting patterns formed in an encapsulation substrate according to an exemplary embodiment of the present disclosure.
Figure 15:
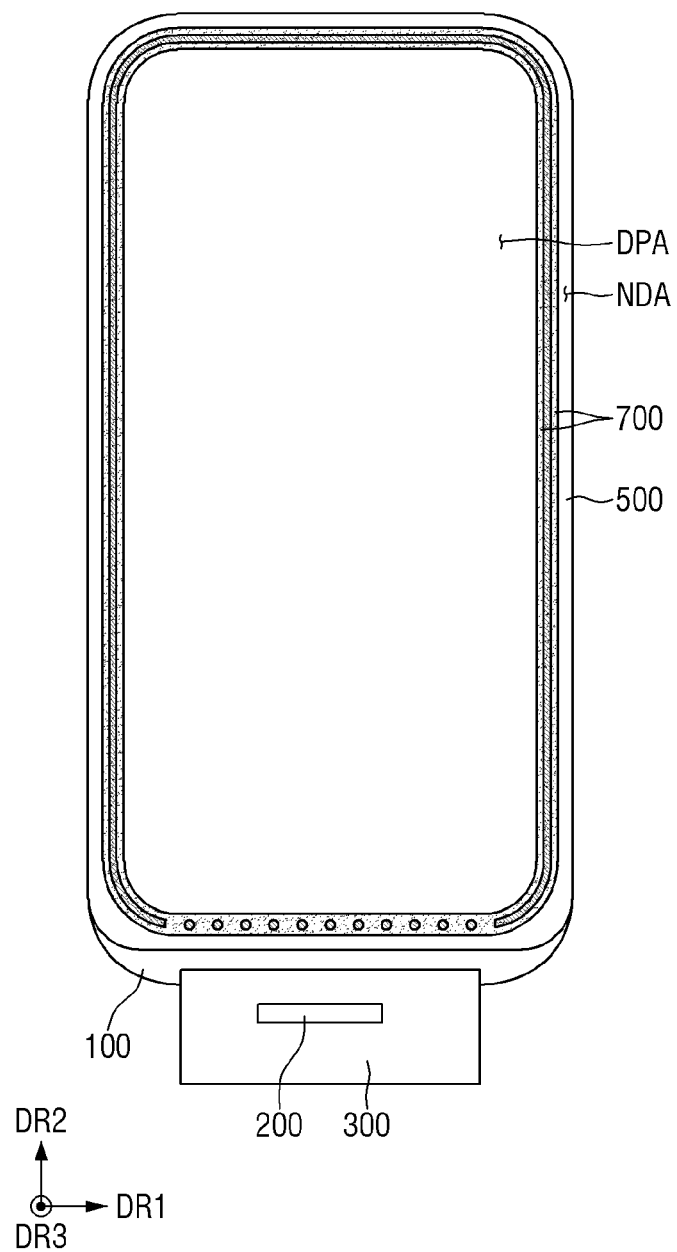
FIG. 15 is a plan view showing an arrangement of fusing patterns according to an exemplary embodiment of the present disclosure.

FIG. 14 is a plan view showing an arrangement of melting patterns formed in an encapsulation substrate according to an exemplary embodiment of the present disclosure. FIG. 15 is a plan view showing an arrangement of fusing patterns according to an exemplary embodiment of the present disclosure.

Referring to FIGS. 14 and 15, the display device 10 according to an exemplary embodiment may include a first extension portion where the sealing member 700 is extended in the first direction DR1 along the non-display area NDA, and a second extension portion where the sealing member 700 is extended in the second direction DR2, and at least one corner portion that is curved and is connected to the first extension portion and the second extension portion. The sealing member 700 may form a closed curve to surround the display area DPA, and may include shorter sides extended in the first direction DR1 of the display panel 100, and a first extension portion and a second extension portion corresponding to the longer sides extended in the second direction DR2. In addition, the sealing member 700 may include a first corner portion that is curved and connected to the first extension portion and the second extension portion.

The shape of the fusing patterns FSP when viewed from the top may be modified in a variety of ways. According to an exemplary embodiment, the fusing patterns FSP are extended along the sealing member 700 in the non-display area NDA of the display device 10 in which the metal line layer MTL is not disposed, and they surround at least a portion of the display area DPA. The metal line layer MTL may not be disposed in a portion of the non-display area NDA, and the sealing member 700 may be disposed directly on the base substrate 101 of the display panel 100 in the portion of the non-display area NDA. The fusing patterns FSP may be extended in a direction the non-display area NDA extends in the non-display area NDA where the metal line layer MTL is not disposed, and may have a continuous line or curve shape. They may have a shape that surrounds at least a portion of the display area DPA. In some exemplary embodiments, the fusing patterns FSP may be formed at least along the first corner portion of the sealing member 700. As the fusing patterns FSP are formed at the first corner portion where the first extension portion meets and the second extension portion of the sealing member 700 that couples the display panel 100 with the encapsulation substrate 500, the durability can be further improved at the first corner portion, which otherwise has a relatively weak bonding force. As will be described later, the process of forming the fusing patterns FSP may be performed via a process of continuously irradiating laser, and the fusing patterns FSP having a linear or curved shape may be disposed in at least some of the non-display area NDA. The width WFM of the fusing pattern FSP may be smaller than the width WS of the sealing member 700, and at least a portion of the sealing member 700 may be in direct contact with the encapsulation substrate 500.

It is to be noted that a plurality of fusing patterns FSP may be spaced apart from one another in a portion of the non-display areas NDA adjacent to the pad area PDA where the metal line layer MTL is disposed. As described above, the encapsulation substrate 500 may include the melting patterns MSP overlapping with the metal line layer MTL disposed in the non-display area NDA of the display panel 100, and the fusing patterns FSP may be disposed to overlap with neither the melting patterns MSP nor the metal line layer MTL. In the non-display area NDA adjacent to the pad area PDA, a plurality of metal line layers MTL may be disposed as shown in FIG. 8, and the melting patterns MSP may be disposed to overlap with the metal line layers MTL. In the display device 10 according to an exemplary embodiment, the fusing patterns FSP may have a linear or curved continuous shape in at least some of the non-display areas NDA, and the fusing patterns FSP may be spaced apart from one another in some other non-display areas NDA. It is, however, to be understood that the present disclosure is not limited thereto.

When the fusing patterns FSP are spaced apart from one another in the first direction DR1 or the second direction DR2, the spacing distance between them may be greater than the maximum width WFP of the fusing patterns FSP. In some exemplary embodiments, the spacing distance between two adjacent fusing patterns FSP may range from about 250 µm to about 300 µm. It is, however, to be understood that the present disclosure is not limited thereto. When the fusing patterns FSP have a smaller size, the spacing distance between the fusing patterns FSP may range from about 25 µm to about 30 µm.

The encapsulation substrate 500 may include a melting pattern area MPA in which the melting patterns MSP are disposed. The melting pattern MSP may be formed such that the melting patterns MSP are vertically in line with the metal line layer MTL overlapping with the sealing member 700 among the metal line layers MTL disposed in the non-display areas NDA of the display panel 100. According to an exemplary embodiment of the present disclosure, the melting pattern area MPA of the encapsulation substrate 500 may be formed only in a first non-display area NDA1 of the non-display areas NDA that is adjacent to the pad area PDA where the display circuit board 300 is disposed. The melting pattern MSP may be disposed to overlap a portion of the metal line layer MTL disposed in the first non-display area NDA1 that is between the sealing member 700 and the display panel 100. The melting pattern MSP may have substantially the same pattern shape as the metal line layer MTL. That is to say, the melting patterns MSP may be spaced apart from one another, and may form the same pattern with the pattern in which the metal line layers MTL are spaced apart from one another. It is, however, to be understood that the present disclosure is not limited thereto. In another exemplary embodiment, the metal line layer MTL overlapping the sealing member 700 may be disposed in second to fourth non-display areas NDA2, NDA3 and NDA4 other than the first non-display area NDA1 among the non-display areas NDA of the display panel 100. In such case, the melting pattern area MPA of the encapsulation substrate 500 may also be formed in the second to fourth non-display areas NDA2, NDA3 and NDA4.

Hereinafter, a method of fabricating a display device 10 according to an exemplary embodiment of the present disclosure will be described.

Figure 16:
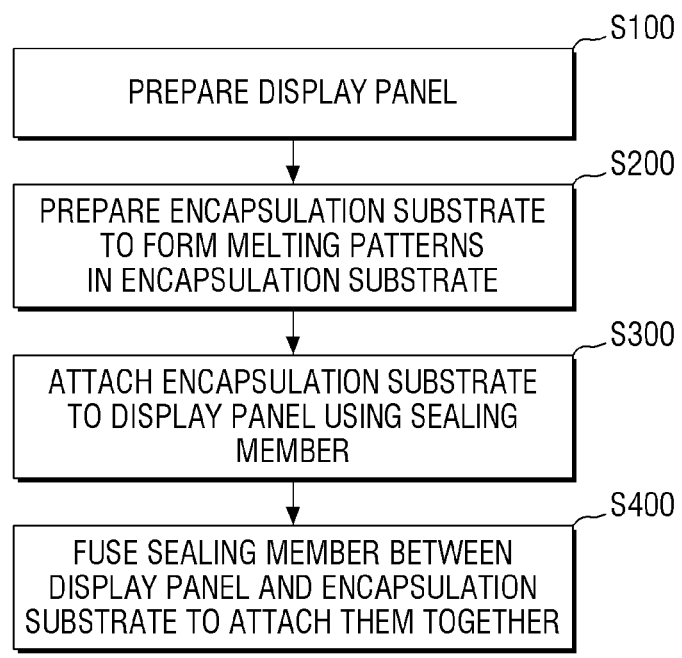
FIG. 16 is a flowchart for illustrating a method for fabricating a display device according to an exemplary embodiment of the present disclosure.

FIG. 16 is a flowchart for illustrating a method for fabricating a display device according to an exemplary embodiment of the present disclosure.

Referring to FIG. 16, the method of fabricating the display device 10 according to an exemplary embodiment of the present disclosure may include preparing a display panel 100 (step S100), and irradiating an encapsulation substrate 500 with a laser or a pulsed laser to form melting patterns MSP (step S200). Subsequently, the method may include disposing a sealing member 700 between the encapsulation substrate 500 where the melting patterns MSP are formed and the display panel 100 to attach them together (step S300), and irradiating the sealing member 700 with a laser or pulsed laser to fuse and attach the sealing member 700 with the display panel 100 and the encapsulation substrate 500 (step S400). In the step of fusing and attaching the sealing member 700 with the display panel 100 and the encapsulation substrate 500 (S400), the fusing patterns FSP disposed across the display panel 100, the sealing member 700 and the encapsulation substrate 500 may be formed. The laser irradiated to form the fusing patterns FSP and the laser irradiated to form the melting patterns MSP may have the same intensity. A more detailed description thereon will be given with reference to other drawings.

FIGS. 17 to 20 are cross-sectional views showing processing steps of fabricating a display device according to an exemplary embodiment of the present disclosure.

Initially, a display panel 100 is prepared (step S100). As described above, the display panel 100 includes a display area DPA in which light-emitting elements EL are disposed, and a non-display area NDA surrounding the display area DPA. The description thereon has already been given above.

Figure 17:
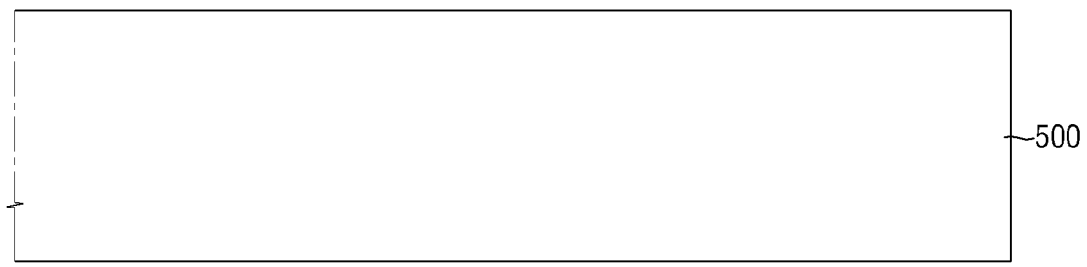
FIGS. 17 to 20 are cross-sectional views showing processing steps of fabricating a display device according to an exemplary embodiment of the present disclosure.
Figure 17:
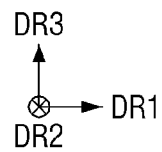
Figure 18:
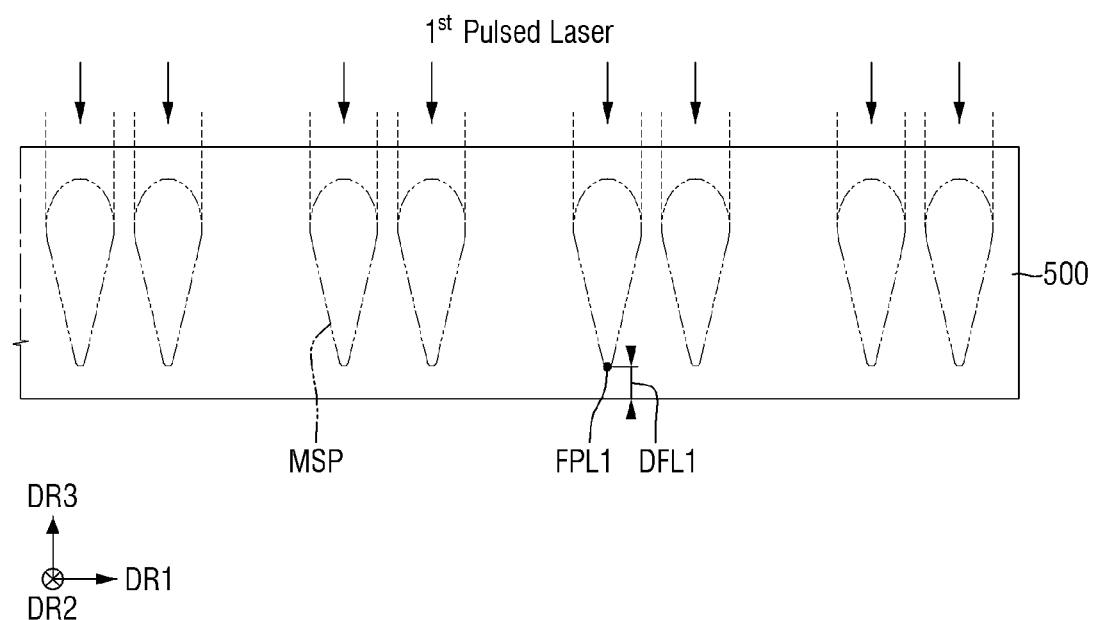

Subsequently, referring to FIGS. 17 and 18, an encapsulation substrate 500 is prepared, and the encapsulation substrate 500 is irradiated with a first pulsed laser to form melting patterns MSP (step S200). The first pulsed laser may be irradiated from above the encapsulation substrate 500. The encapsulation substrate 500 may include a transparent material, and the first pulsed laser may melt a portion of the material in the encapsulation substrate 500. Subsequently, the melting patterns MSP may be formed by drying and solidifying the melted materials. After melted and solidified, the portion of the material may form the melting area MA of the melting patterns MSP, and may have a different refractive index from the refractive index of the adjacent region outside the melting area MA. According to an exemplary embodiment of the present disclosure, the first pulsed laser may be set such that a first laser focus FPL1 is spaced apart from the lower surface of the encapsulation substrate 500 by a predetermined distance DFL1 (see FIG. 18). The distance DLF1 between the first laser focus FPL1 and the lower surface of the encapsulation substrate 500 may vary depending on the intensity of the first pulsed laser and the laser width. The melting patterns MSP may include a first portion that has a width increasing from the lower surface toward the upper surface of the encapsulation substrate 500 and may be formed inside the encapsulation substrate 500. Each of the melting patterns MSP may have a shape having a width increasing in the direction away from the first laser focus FPL1. It is, however, to be understood that the present disclosure is not limited thereto.

In an exemplary embodiment, the distance DLF1 between the first laser focus FPL1 of the first pulsed laser and the lower surface of the encapsulation substrate 500 may range about 0.1 μm to about 200 μm. In addition, the first pulsed laser may be irradiated at a frequency of about 1 kilohertz (kHz) to about 10 megahertz (MHz) for about 10 femtoseconds (fs) to about 50 picoseconds (ps), and may have an energy of 0.1 microjoules (μJ) or higher. The first pulsed laser may melt the material of the encapsulation substrate 500 partially. As some regions of the encapsulation substrate 500 is melted by the first pulsed laser and then solidified, the melting patterns MSP having a different crystal or structure from the structure of the nearby region (i.e., adjacent region outside the melting pattern MSP) may be formed. According to an exemplary embodiment of the present disclosure, the melting patterns MSP may have a different crystal or structure from the nearby region, and may have a different refractive index. In some exemplary embodiments, the refractive index of the melting patterns MSP may be less than the refractive index of the nearby region, and the laser irradiated onto the encapsulation substrate 500 in a subsequent process will be reflected at the melting interfaces ML of the melting patterns MSP. In this manner, the encapsulation substrate 500 can prevent the laser from being irradiated onto the regions overlapping the melting patterns MSP.

Subsequently, referring to FIG. 19, a sealing member 700 is prepared between the encapsulation substrate 500 where a melting pattern ("MSP") is formed and the display panel 100, and then the encapsulation substrate 500 and the display panel 100 are attached together (step S300). The sealing member 700 may include frit as described above, and the frit may be formed via a drying process and a firing process after it is printed on the encapsulation substrate 500 or the display panel 100. In some exemplary embodiments, the sealing member 700 may be formed by preparing frit crystals on one surface of the display panel 100 or the encapsulation substrate 500 and then drying and firing them. The frit crystals may be glass powders to which an additive is selectively added. As described above, the sealing member 700 may include the frit, and the sealing member 700 may be formed by melting and curing the frit crystals to form a structure having glass properties. It is, however, to be understood that the present disclosure is not limited thereto.

Figure 19:
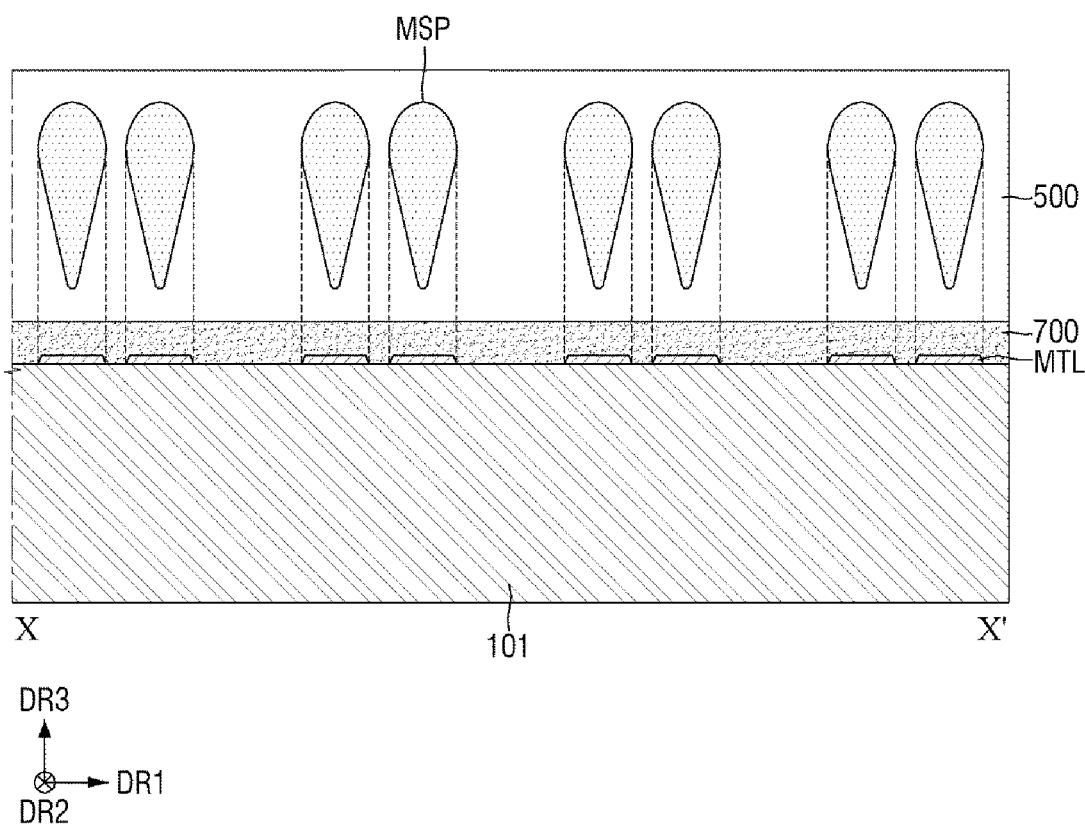

Although only a portion of the non-display area NDA is shown in FIG. 19, the sealing member 700 may be disposed between the display panel 100 and the encapsulation substrate 500 to surround the display area DPA. The description thereon has already been given above.

Incidentally, according to an exemplary embodiment of the present disclosure, in the step of attaching the sealing member 700 between the encapsulation substrate 500 and the display panel 100, the encapsulation substrate 500 and the display panel 100 may be aligned such that the melting patterns MPS overlap with the metal line layer MTL. As described above, the melting patterns MSP can prevent the laser for forming the fusing pattern FSP from penetrating. To prevent the metal line layer MTL from being damaged, the melting patterns MSP may overlap the metal line layer MTL in the thickness direction. The description thereon has already been given above.

The sealing member 700 may include the frit and may couple the display panel 100 with the encapsulation substrate 500. In the step of FIG. 19, the sealing member 700 is disposed in contact with the upper surface of the display panel 100 and the lower surface of the encapsulation substrate 500 and does not bond them to each other. Specifically, the sealing member 700 may be disposed to form physical boundaries with the display panel 100 and with the encapsulation substrate 500 to bond the display panel 100 and the encapsulation substrate 500 to each other. A method of fabricating the display device 10 according to an exemplary embodiment of the present disclosure may include irradiating a pulsed laser onto at least the sealing member 700 to fuse the display panel 100, the sealing member 700, and the encapsulation substrate 500 to attach them together.

Figure 20:
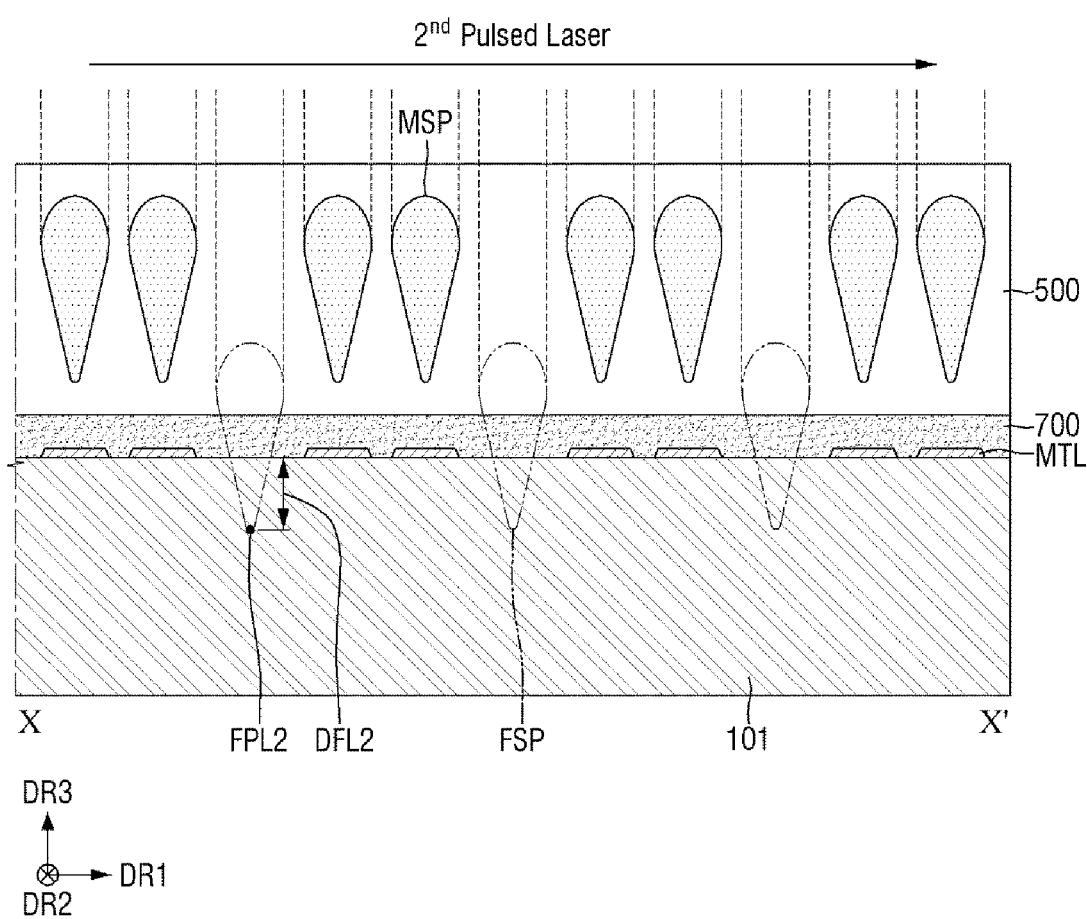

Referring to FIG. 20, the sealing member 700 is irradiated with a second pulsed laser to form fusing patterns FSP, and the display panel 100, the sealing member 700 and the encapsulation substrate 500 are partially fused and attached together (step S400). The second pulsed laser may be irradiated onto at least the sealing member 700 to form fusing patterns FSP disposed across the sealing member 700 between the display panel 100 and the encapsulation substrate 500. For example, the second pulsed laser may be irradiated onto the base substrate 101 of the display panel 100, the sealing member 700, and the encapsulation substrate 500.

According to an exemplary embodiment of the present disclosure, the sealing member 700 may be made of transparent frit. The sealing member 700 may include a material that transmits light such that the second pulsed laser can be irradiated across the encapsulation substrate 500 and the display panel 100. The second pulsed laser may be irradiated from the upper surface of the encapsulation substrate 500 or the lower surface of the display panel 100 and may penetrate the sealing member 700 to reach the encapsulation substrate 500 or the display panel 100. Accordingly, the sealing member 700 and the display panel 100 may be fused together and the sealing member 700 and the encapsulation substrate 500 may be fused together.

The second pulsed laser and the first pulsed laser may have substantially the same intensity. The second pulsed laser may partially fuse materials of the encapsulation substrate 500, the sealing member 700 and the display panel 100. The second pulsed laser may be irradiated along the sealing member 700 from above the encapsulation substrate 500. In some exemplary embodiments, the second pulsed laser may be irradiated continuously along the non-display areas NDA in which the sealing member 700 is disposed. The second pulsed laser can pass through the encapsulation substrate 500 but cannot pass through the melting patterns MSP due to the difference in refractive index at the melting interfaces ML of the melting patterns MSP. The second pulsed laser may be irradiated onto the sealing member 700 through the regions of the encapsulation substrate 500 where the melting patterns MSP are not disposed, such that the fusing patterns FSP do not overlap the melting patterns MSP and the metal line layer MTL.

According to an exemplary embodiment of the present disclosure, the second pulsed laser may be set such that a second laser focus FPL2 is located inside the display panel 100, and it may be irradiated from above the encapsulation substrate 500. The distance between the upper surface of the display panel 100 and the second laser focus FPL2 of the second pulsed laser may range from about 0.1 μm to about 200 μm. Accordingly, the fusing patterns FSP may have a shape having a width increasing along a direction away from the second laser focus FPL2. It is, however, to be understood that the present disclosure is not limited thereto.

The second pulsed laser and the first pulsed laser may have substantially the same intensity, and the fusing patterns FSP and the melting patterns MSP may have substantially the same shape. It is to be noted that there is a different in that the first laser focus FPL1 of the first pulsed laser is set inside the encapsulation substrate 500 to form the melting patterns MSP. The melting patterns MSP may include a melting area MA that is formed as the material of the encapsulation substrate 500 is melted and solidified, and a melting interface ML.

The second pulsed laser may be irradiated along the sealing member 700 from above the encapsulation substrate 500, but cannot pass through the melting patterns MSP of the encapsulation substrate 500. As a result, only the regions where the melting patterns MSP are not disposed can be irradiated with the second pulsed laser. The fusing patterns FSP formed by irradiating the second pulsed laser may not overlap with the melting patterns MSP and the metal line layer MTL, and thus it is possible to prevent the metal line layer MTL of the display panel 100 from being damaged. The display device 10 according to the exemplary embodiment of the present disclosure includes the sealing member 700 disposed between the display panel 100 and the encapsulation substrate 500, and the fusing patterns FSP disposed across them to include the fusing area FACE, such that the bonding force between the display panel 100 and the encapsulation substrate 500 can be enhanced, and the durability of the display device 10 against external impact can be improved.

Hereinafter, display devices according to a variety of exemplary embodiments of the present disclosure will be described reference to other drawings.

Figure 21:
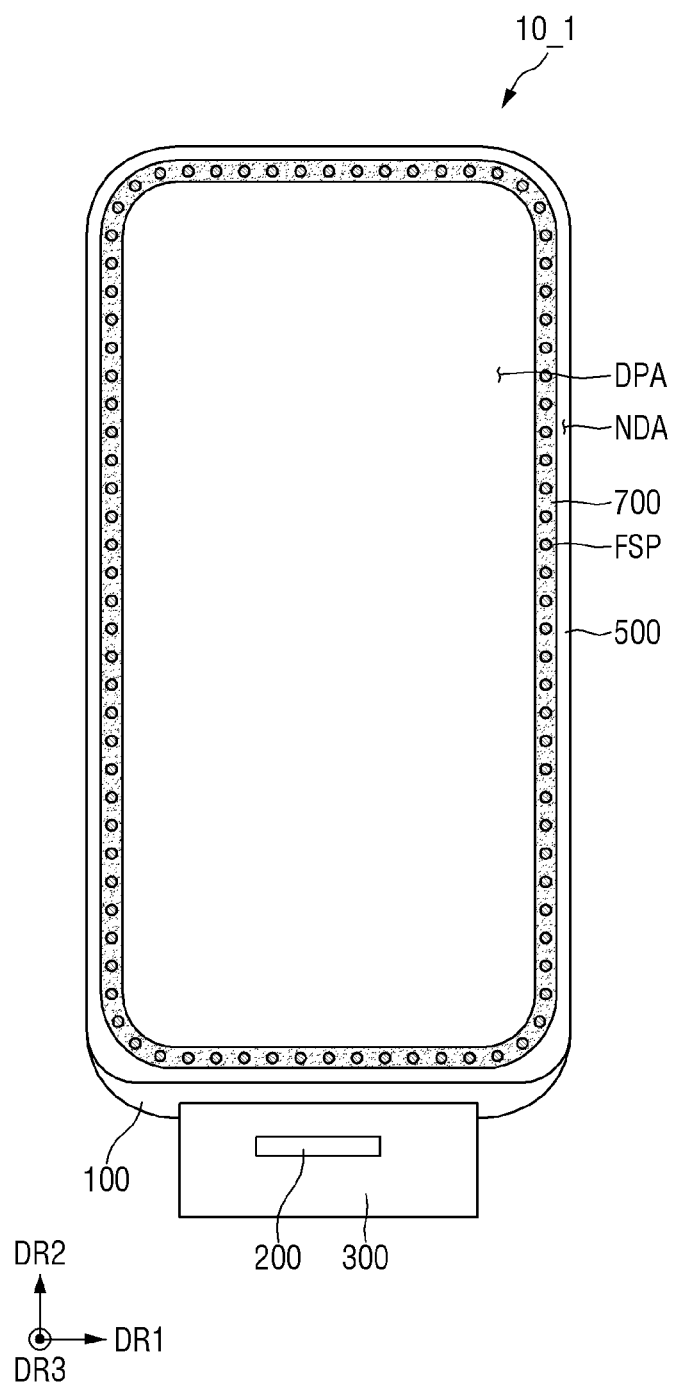
FIG. 21 is a plan view showing fusing patterns disposed in a display device according to another exemplary embodiment of the present disclosure.

FIG. 21 is a plan view showing fusing patterns disposed in a display device according to another exemplary embodiment of the present disclosure.

Referring to FIG. 21, in a display device 10_1 according to an exemplary embodiment, a plurality of fusing patterns FSP may be spaced apart from one another to form a pattern. The display device 10_1 of FIG. 21 is different from the display device according to the exemplary embodiment of FIGS. 7 and 15 in that the arrangement of the fusing patterns FSP is different. In the following description, descriptions will focus on the difference, and the redundant description will be omitted.

The fusing patterns FSP may be formed between the display panel 100 and the encapsulation substrate 500 and may be disposed along the sealing member 700. According to an exemplary embodiment of the present disclosure, the plurality of fusing patterns FSP may be spaced apart from one another along the sealing member 700 to form a pattern, and the fusing patterns FSP may be formed at least along the first corner portion of the sealing member 700. As the fusing patterns FSP are formed at the first corner portion where the first extension portion meets and the second extension portion of the sealing member 700 that couples the display panel 100 with the encapsulation substrate 500, the durability can be improved at the first corner portion, which otherwise has a relatively weak bonding force.

The second pulsed laser to form the fusing patterns FSP may not be necessarily continuously irradiated, but may be selectively irradiated to some regions. In such case, the fusing patterns FSP may be selectively formed only in the region irradiated with the second pulsed laser, and may form patterns spaced apart from each other on the whole surface of the display device 10_1 along the sealing member 700. The fusing patterns FSP may be formed selectively in some regions between the display panel 100 and the encapsulation substrate 500 where the bonding force is weak.

In addition, the plurality of fusing patterns FSP may be disposed in the first direction DR1, i.e., the width direction of the sealing member 700 or the second direction DR2.

Figure 22:
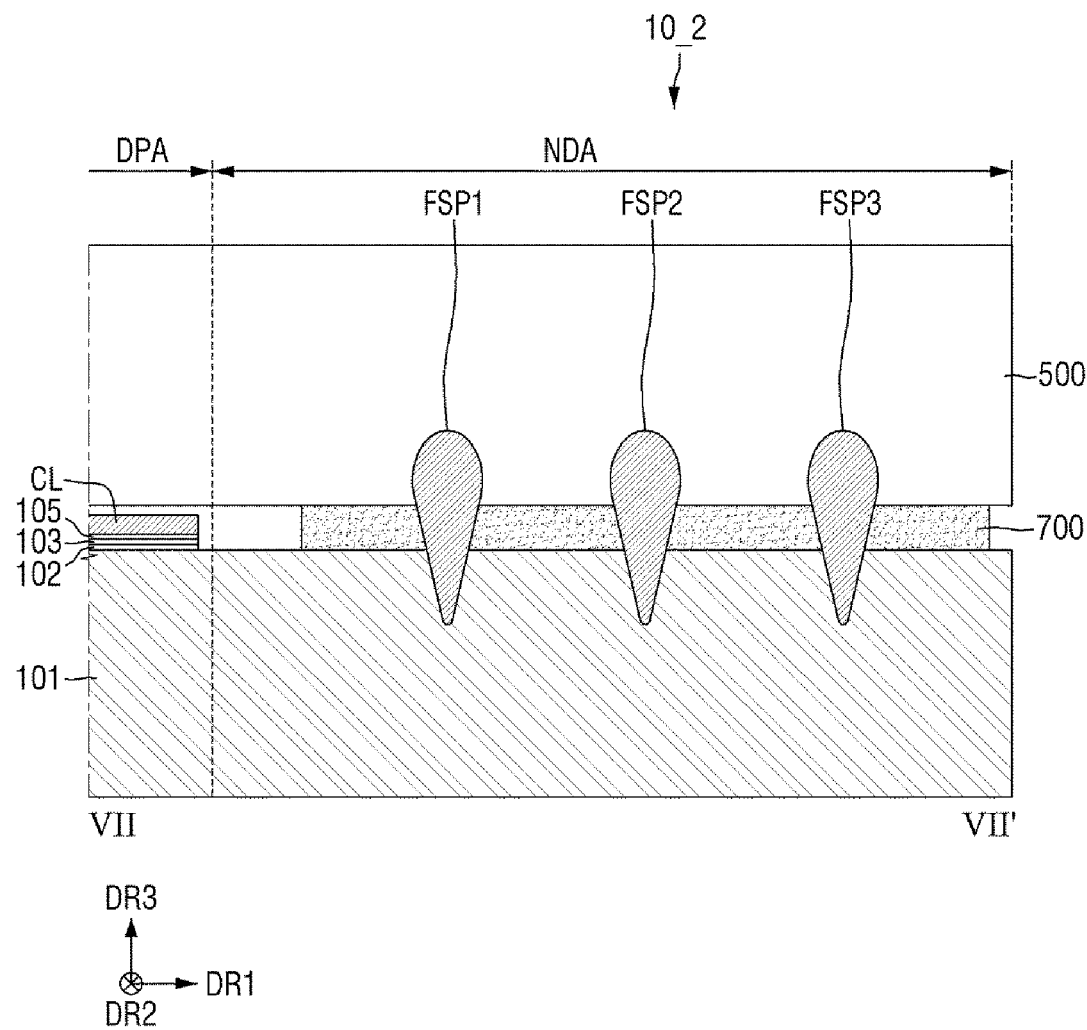
FIG. 22 is a cross-sectional view showing fusion patterns disposed in a display device according to another exemplary embodiment.

FIG. 22 is a cross-sectional view showing fusing patterns disposed in a display device according to another exemplary embodiment. FIG. 22 shows a cross section of the non-display area NDA in the first direction DR1 of the display area DPA, which is not adjacent to the pad area PDA among the non-display areas NDA of the display device 10.

Referring to FIG. 22, a display device 10_2 according to an exemplary embodiment may include a greater number of fusing patterns FSP formed in the width direction of the sealing member 700. The sealing member 700 of the display device 10_2 may have a pre width WS (see FIG. 7), and a plurality of second pulsed lasers (see FIG. 18) may be irradiated in the width direction of the sealing member 700, such that the plurality of fusing patterns FSP may be formed. The fusing patterns FSP may include a first fusing pattern FSP1 adjacent to the display area DPA, a third fusing pattern FSP3 formed on the outermost portion of the non-display area NDA, and a second fusing pattern FSP2 formed therebetween. The first to third fusing patterns FSP1, FSP2 and FSP3 may be spaced apart from one another in the width direction of the sealing member 700. Although not shown in the drawings, first to third fusing patterns FSP1, FSP2 and FSP3 may be arranged along the second extension portion of the sealing member 700, each of them may form patterns spaced apart from one another in the second direction DR2. According to an exemplary embodiment of the present disclosure, the display device 10_2 may include a greater number of fusing patterns FSP arranged along the width direction of the sealing member 700 such that the bonding force between the display panel 100 and the encapsulation substrate 500 can be further enhanced.

As the display device 10 includes the fusing patterns FSP in addition to the sealing member 700, the bonding force between the display panel 100 and the encapsulation substrate 500 can be further enhanced. According to an exemplary embodiment of the present disclosure, the display device 10 includes the fusing patterns FSP to reduce the width of the sealing member 700 and thus can have a wider display area DPA.

Figure 23:
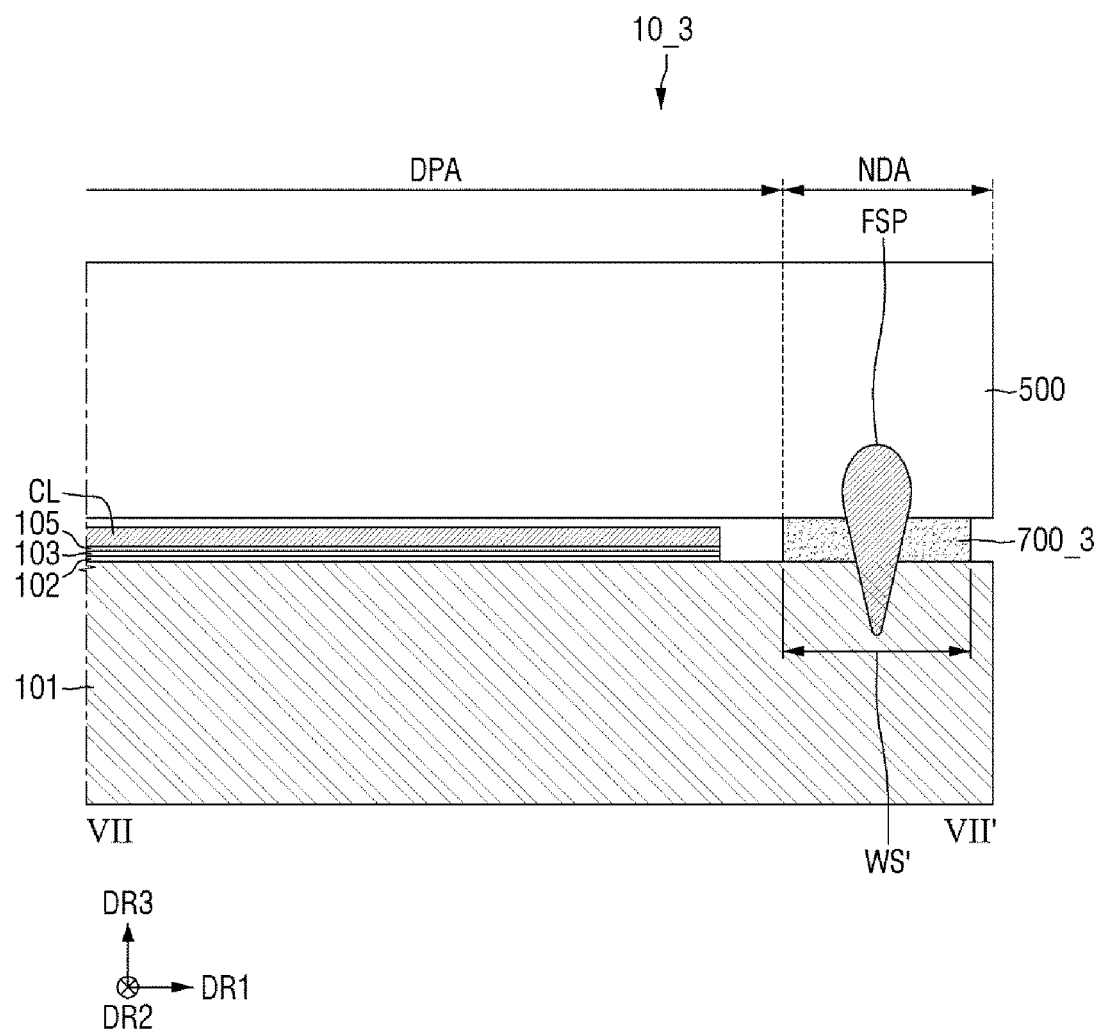
FIG. 23 is a cross-sectional view showing a portion of a display device according to another exemplary embodiment of the present disclosure.

FIG. 23 is a cross-sectional view showing a portion of a display device according to another exemplary embodiment of the present disclosure.

Referring to FIG. 23, in a display device 10_3 according to an exemplary embodiment of the present disclosure, a width WS' of a sealing member 700_3 may be smaller. A fusing pattern FSP may be disposed across a sealing member 700_3 having a small width, a display panel 100 and an encapsulation substrate 500. The width WS' of the sealing member 700_3 may have the lowest value as long as it is greater than at least the maximum width WFP of the fusing pattern FSP (see FIG. 13). As the display device 10_3 according to the exemplary embodiment of the present disclosure includes the fusing patterns FSP, the bonding force between the display panel 100 and the encapsulation substrate 500 can be enhanced even if the sealing member 700_3 has the small width WS'. In addition, the non-display area NDA can be reduced to achieve a larger display area DPA.

In some exemplary embodiments, the width WS' of the sealing member 700_3 may have a range larger than the maximum width WFP of the fusing patterns FSP and less than that of the exemplary embodiment of FIG. 7. For example, the maximum width WFP of the fusing patterns FSP is approximately 100 µm, the width WS' of the sealing member 700_3 may have a range of 100 µm to 200 µm. In some exemplary embodiments, when the maximum width WFP of the fusing patterns FSP is approximately 10 µm as they are formed by a laser having a small width, the width WS' of the sealing member 700_3 may have a range of 10 µm to 20 µm. It is, however, to be understood that the present disclosure is not limited thereto. The above numerical values are merely illustrative and the exemplary embodiments of the present disclosure are not limited by the numerical values. The exemplary embodiment of FIG. 23 is different from the exemplary embodiment of FIG. 7 in that the width WS' of the sealing member 700_3 is different. In the following description, the redundant description will be omitted.

Figure 24:
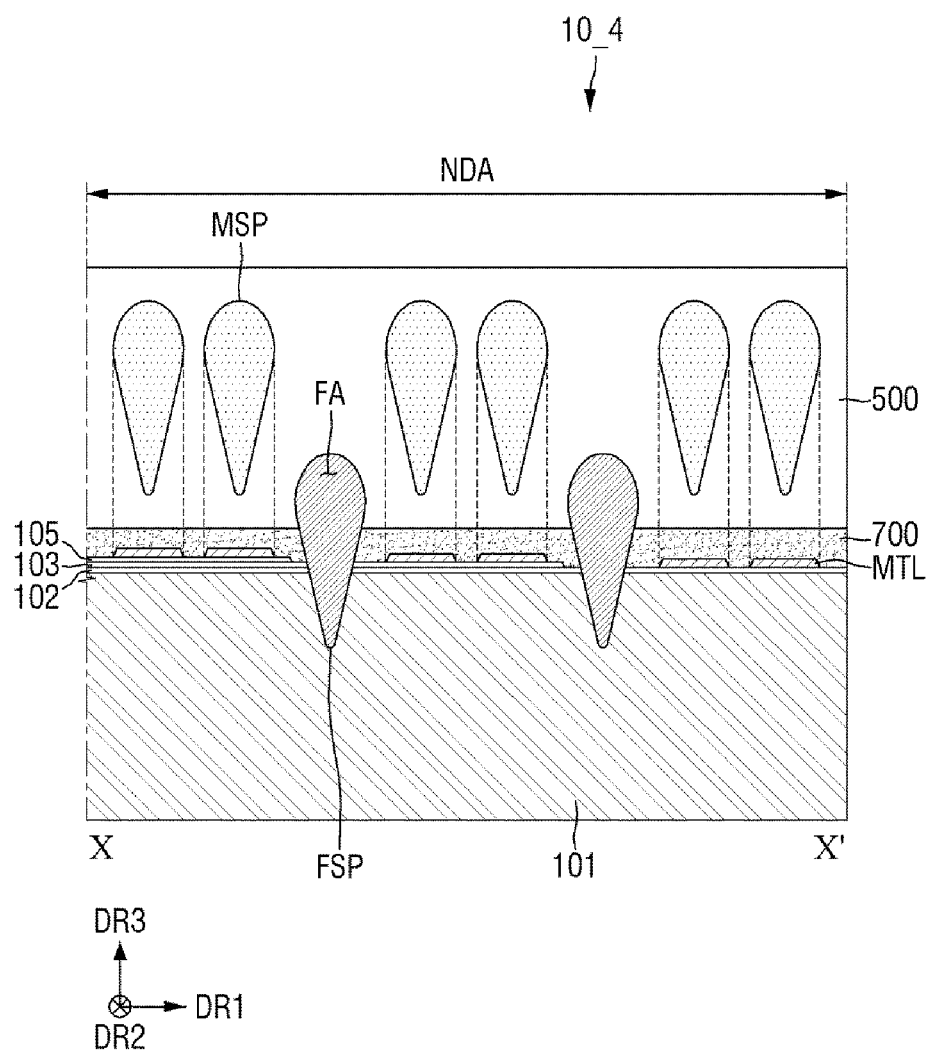
FIG. 24 is a cross-sectional view showing a portion of a display device according to yet another exemplary embodiment of the present disclosure.

FIG. 24 is a cross-sectional view showing a portion of a display device according to yet another exemplary embodiment of the present disclosure.

Referring to FIG. 24, in a display device 10_4 according to an exemplary embodiment, at least one insulating layer may be disposed between the display panel 100 and the metal line layer MTL. At least one of the buffer layer 102, the gate insulating layer 103 and the interlayer dielectric layer 105 of the display panel 100 may be disposed in the non-display area NDA, and the sealing member 700 and the metal line layer MTL may be disposed on at least one of the insulating layers. Accordingly, at least a portion of the lower surface of the sealing member 700 may be in contact with the insulating layers, and the material of the insulating layer, in addition to the base substrate 101 of the display panel 100 and the encapsulation substrate 500 and the sealing member 700, may be mixed in fusion areas FA of the fusing patterns FSP. The fusing patterns FSP may pass through the insulating layers and may be disposed from the base substrate 101 to the sealing member 700 and the encapsulation substrate 500. The exemplary embodiment of FIG. 24 is different from the exemplary embodiment of FIG. 10 in that a metal line layer MTL is disposed directly on at least one of the buffer layer 102, the gate insulating layer 103 and the interlayer dielectric layer 105. In the following description, the redundant description will be omitted.

The metal line layer MTL may not necessarily be disposed only in the first non-display area NDA adjacent to the pad area PDA among the non-display areas NDA. In some exemplary embodiments, the metal line layer MTL may be disposed in the other non-display areas NDA2, NDA3 and NDA4 than the first non-display area NDA, and more melting pattern areas MPA where the melting patterns MSP are disposed may be formed in the encapsulation substrate 500 if there are more metal line layers MTL.

Figure 25:
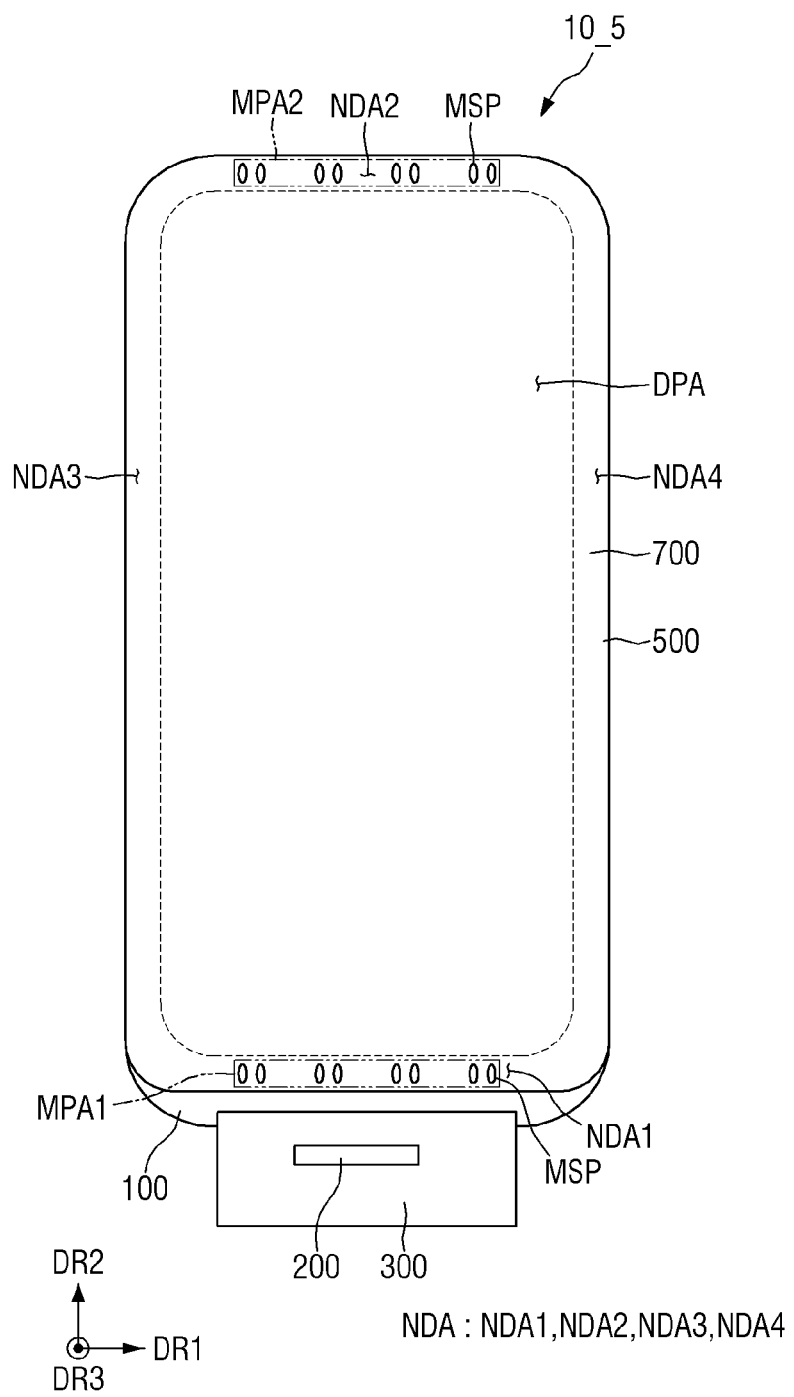
FIGS. 25 and 26 are plan views showing an arrangement of melting pattern areas formed in an encapsulation substrate of a display device according to another exemplary embodiment.
Figure 26:
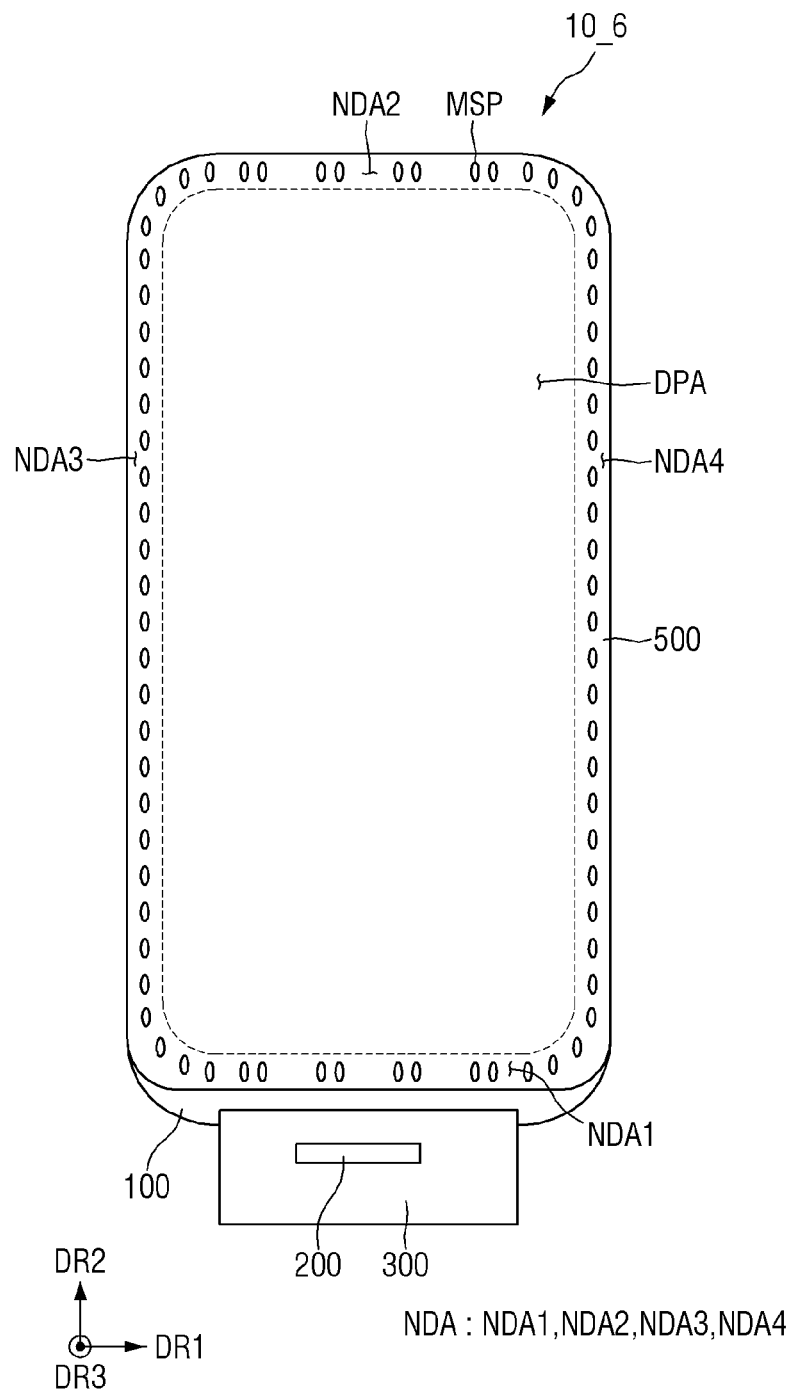

FIGS. 25 and 26 are plan views showing an arrangement of melting pattern areas formed in an encapsulation substrate of a display device according to another exemplary embodiment.

Referring to FIGS. 25 and 26, in display devices 10_5 and 10_6 according to the exemplary embodiment of the present disclosure, an encapsulation substrate 500 may include a second melting pattern area MPA2 (see FIG. 25) formed in a second non-display area NDA2 in addition to a first melting pattern area MPA1 formed in a first non-display area NDA1. In addition, the melting pattern area MPA may be formed in other non-display areas, e.g., from the third non-display area NDA3 to the fourth non-display area NDA4. Although not shown in the drawings, according to the exemplary embodiment of FIGS. 25 and 26, a display panel 100 includes a greater number of metal line layers MTL disposed in non-display areas, and an encapsulation substrate 500 includes a greater number of melting pattern areas MPA.

As described above, first and second scan drivers 110 and 120 may be disposed in the non-display areas NDA of the display panel 100, including fan-out lines FL. The fan-out line FL or the like may be disposed in the first non-display area NDA1, circuit elements or lines of the first scan driver 110 may be disposed in the third non-display area NDA3, and circuit elements or lines of the second scan driver 120 may be disposed the fourth non-display area NDA4. Other lines or circuit elements may be disposed in the second non-display area NDA2. In some exemplary embodiments, a greater number of metal line layers MTL may be disposed in each of the non-display areas NDA1, NDA2, NDA3 and NDA4 of the display panel 100, which overlap the sealing member 700.

The fusing patterns FSP disposed in the non-display area NDA of the display device 10 may be disposed across the sealing member 700, the display panel 100 and the encapsulation substrate 500, and do not overlap the metal line layer MTL. According to an exemplary embodiment of the present disclosure, fusing patterns MSP may be further disposed in the encapsulation substrate 500 of the display devices 10_5 and 10_6 in order to prevent a second pulsed laser for forming the fusing patterns FSP from being irradiated onto the metal line layer MTL. The encapsulation substrate 500 may include melting pattern areas MPA in which melting patterns MSP in line with and overlapping the metal line layer MTL of the display panel 100 are disposed. The melting pattern areas MPA may include a first melting pattern area MPA1 disposed in the first non-display area NDA1 and a second melting pattern area MPA2 disposed in the second non-display area NDA2 (the display device 10_5 in FIG. 25). In addition, the melting pattern area MPA may substantially entirely coincide with the non-display area NDA by disposing the melting patterns MSP in the third non-display area NDA3 and the fourth non-display area NDA4. As the display devices 10_5 and 10_6 include the melting patterns MSP and the melting pattern areas MPA overlapping the metal line layers MTL, it is possible to prevent damage to the metal line layers MTL and to enhance the bonding force between the display panel 100 and the encapsulation substrates 500.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A display device comprising:
a display panel comprising a display area and non-display areas surrounding the display area;
an encapsulation substrate disposed on the display panel and comprising melting patterns disposed in regions overlapping the non-display areas;
a sealing member disposed between the display panel and the encapsulation substrate to couple the display panel with the encapsulation substrate; and
fusing patterns disposed across the sealing member and the encapsulation substrate,
wherein the display panel further comprises a metal line layer disposed in at least a portion of the non-display areas,
wherein at least a portion of the sealing member is disposed on the metal line layer in the non-display areas,
wherein the melting patterns are disposed to overlap the metal line layer in a thickness direction, and
wherein the fusing patterns are disposed not to overlap the metal line layer in the thickness direction.

2. The display device of claim 1, wherein a maximum width of the melting patterns is equal to or greater than a width of the metal line layer.

3. The display device of claim 2, wherein a maximum width of the fusing patterns is equal to the maximum width of the melting patterns.

4. The display device of claim 1, wherein each of the melting patterns comprises a melting interface and a melting area that has a different crystal structure from a crystal structure of an adjacent region outside the melting interface.

5. The display device of claim 4, wherein a refractive index of the melting patterns is smaller than a refractive index of the adjacent region outside the melting interface.

6. The display device of claim 4, wherein the melting patterns are spaced apart from a lower surface of the encapsulation substrate.

7. The display device of claim 1, wherein the fusing patterns are disposed across the sealing member, the display panel and the encapsulation substrate, and
each of the fusing patterns comprises a fusing area where materials of the sealing member, the display panel and the encapsulation substrate are fused.

8. The display device of claim 1, wherein at least a portion of the sealing member directly contacts the display panel at a first boundary surface and the encapsulation substrate at a second boundary surface, and
wherein no physical boundary is on virtual extended lines in the fusing patterns, the virtual extended lines extending from the first boundary surface and the second boundary surface.

9. The display device of claim 8, wherein each of the fusing patterns comprises a first portion disposed in the display panel, a second portion disposed in the sealing member, a third portion disposed in the encapsulation substrate, a third boundary surface between the second portion and the sealing member, a fourth boundary surface between the third portion and the encapsulation substrate, and a fifth boundary surface between the first portion and the display panel.

10. The display device of claim 9, wherein the third portion of each of the fusing patterns comprises a material of the sealing member.

11. The display device of claim 9, wherein the second portion of each of the fusing patterns comprises a material of the encapsulation substrate.

12. The display device of claim 9, wherein a width of the first portion in the virtual extended line extending from the first boundary surface of the fusing patterns is smaller than a width of the third portion in the virtual extended line extending from the second boundary surface.

13. The display device of claim 1, wherein a height of the fusing patterns is greater than a thickness of the sealing member in the thickness direction.

14. The display device of claim 13, wherein the thickness of the sealing member ranges from about 4.5 micrometers (μm) to about 6 μm, and the height of the fusing patterns ranges from about 8 μm to about 12 μm.

15. The display device of claim 14, wherein a maximum width of the fusing patterns ranges from about 8 μm to about 12 μm, and the width of the sealing member is greater than the maximum width of the fusing patterns.

16. The display device of claim 2, further comprising:
an insulating layer disposed on the display panel in the display areas, wherein the metal line layer is disposed on the insulating layer.

17. A display device comprising:
a first substrate comprising a display area where a plurality of light-emitting elements is disposed, and non-display areas surrounding the display area;
a second substrate disposed on the first substrate and comprising melting patterns disposed in a region overlapping the non-display areas;
a metal line layer disposed on the non-display areas of the first substrate;
a sealing member disposed between the first substrate and the second substrate and surrounding the display area in the non-display areas; and
fusing patterns disposed in the sealing member between the first substrate and the second substrate,
wherein the second substrate comprises a melting pattern area in which the melting patterns are disposed,
wherein the melting pattern area is in a portion of the non-display areas in which the metal line layer is disposed, and
wherein the fusing patterns are disposed not to overlap with the melting patterns in a plan view.

18. The display device of claim 17, wherein each of the melting patterns comprises a melting interface and a melting area that has a different crystal structure from a crystal structure of an adjacent region outside the melting interface, and
wherein a refractive index of each of the melting patterns is smaller than a refractive index of the adjacent region outside the melting interface.

19. The display device of claim 18, wherein the metal line layer is disposed only in a first non-display area of the non-display areas located on one side of the display area, and
wherein the melting patterns are disposed only in a region overlapping the first non-display area.

20. The display device of claim 18, wherein the metal line layer is disposed to surround the display area in the non-display area, and wherein the melting patterns are disposed to overlap the metal line layer in the plan view.

21. The display device of claim 18, further comprising:
an insulating layer disposed on the first substrate in the non-display areas, wherein the metal line layer is disposed on the insulating layer.

\* \* \* \* \*